(12) United States Patent
Fukushige et al.

(10) Patent No.: US 6,190,824 B1
(45) Date of Patent: Feb. 20, 2001

(54) PHOTOSENSITIVE COMPOSITION

(75) Inventors: Yuuichi Fukushige; Masanobu Takashima, both of Shizuoka-ken (JP)

(73) Assignee: Fuji Photo Film Co., Ltd., Kanagawa (JP)

( * ) Notice: Under 35 U.S.C. 154(b), the term of this patent shall be extended for 0 days.

(21) Appl. No.: 09/258,260

(22) Filed: Feb. 26, 1999

(30) Foreign Application Priority Data

Mar. 3, 1998 (JP) .................................................. 10-051178
Sep. 21, 1998 (JP) .................................................. 10-266947

(51) Int. Cl.[7] .............................. G03F 7/021; G03F 7/031
(52) U.S. Cl. ......................... 430/163; 430/171; 430/176; 430/281.1
(58) Field of Search ................................. 430/281.1, 163, 430/171, 176

(56) References Cited

U.S. PATENT DOCUMENTS

| | | | |
|---|---|---|---|
| 5,200,292 | 4/1993 | Shinozaki et al. | 430/178 |
| 5,532,373 | * 7/1996 | Matsumoto et al. | 546/4 |
| 5,932,393 | * 8/1999 | Cunningham et al. | 430/281.1 |
| 5,952,152 | * 9/1999 | Cunningham et al. | 430/281.1 |
| 6,011,180 | * 1/2000 | Cunningham et al. | 568/6 |

FOREIGN PATENT DOCUMENTS

| | | | |
|---|---|---|---|
| 2 307 472 | 5/1997 | (GB) | C07F/5/02 |
| 2 307 473 | 5/1997 | (GB) | C07F/5/02 |
| 2 307 474 | 5/1997 | (GB) | C07F/5/02 |

* cited by examiner

*Primary Examiner*—John S. Chu
(74) *Attorney, Agent, or Firm*—Sughrue, Mion, Zinn, Macpeak & Seas, PLLC

(57) ABSTRACT

Disclosed is a photosensitive composition useful for preparation of various imaging materials and having good stability over time and a high sensitivity. The composition comprises a polymerizable monomer, a photopolymerization initiator, and a diazonium salt having a specific, borate anion portion represented by the general formula (I-1) or (I-2) given below, or the like. A combination of a specific borate compound and a general-purpose diazonium salt can also be used in place of the above-mentioned diazonium salt.

General formula (I-1)

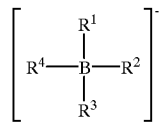

General formula (I-2)

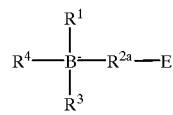

2 Claims, No Drawings

PHOTOSENSITIVE COMPOSITION

BACKGROUND OF THE INVENTION

1. Field of the Invention

The present invention relates to a photosensitive composition having a good storage stability and a high sensitivity.

2. Description of the Related Art

Heretofore, various image forming methods have been known in diazo-process photography. Examples of these methods include: dye-imaging, which utilizes photodecomposition of an aromatic diazo compound, such as a diazonium salt, a diazo sulfonate, or a diazo compound, for example, an iminoquinone diazide, a naphthoquinone diazide, or the like, together with a coupling agent according to need; preparation of printing plates, proofs, mask films, and the like by utilizing a hardening reaction or a solubilization phenomenon; and foam imaging.

As to photopolymerization, in the field of preparation of materials for printing plates, proofs, mask films, photoresists, and the like, there have been known various image forming methods which utilize changes in properties, such as solubility, tackiness, adhesion, and the like due to a photochemical hardening reaction.

In the diazo-process photography, the amount of energy required for photodecomposition of a photodecomposable aromatic diazo compound to be used is generally very large and sensitive wavelengths extend into a visible blue light region. Consequently, the scope in which diazo-process photography can be used is limited to materials that have a low sensitivity and are printed by ultraviolet light. In order to solve this problem, intense studies have been conducted regarding spectral sensitization of photodecomposable aromatic diazo compounds in a visible light region. As a result, some specific dyes, such as riboflavin, porphyrin, chlorophyll, and the like, are now known to act as spectral sensitizers for diazonium salts and diazo sulfonates. As another example of the sensitization method, Japanese Patent Application Publication (JP-B) No. 50-21,247 discloses a photosensitive material for diazo-process photography wherein the photosensitive composition comprises an aromatic diazo compound together with at least one compound selected from the group consisting of a sulfinic acid and a salt of sulfinic acid in combination with a sensitizing dye.

However, none of these methods of prior art have been put to practice, because these methods are associated with drawbacks, for example, poor stability and restricted scope of selectivity in spectral wavelength regions. Further, these systems have little or no effect in the spectral sensitization for the photodecomposition of diazo compounds such as naphthoquinone diazides.

Despite continuous development of new spectrally sensitizing technologies for photopolymerization, the region of spectral wavelengths that can be used in prior art is still up to 500 nm, and therefore a system, that can be spectrally sensitized in a wavelength region ranging from 500 nm to infrared light and has a high sensitivity and good stability has not been put to practical use.

As a candidate that may overcome the above-mentioned drawbacks, Japanese Patent Application Laid-Open (JP-A) No. 62-143,044 discloses a photopolymerization initiator comprising a cationic dye/borate anion complex. This system can be spectrally sensitized freely in a region ranging from blue light to infrared light, has good stability, and exhibits a high level of sensitivity. However, since the sensitivity is several mJ/cm$^2$, the sensitivity needs to be upgraded before the system is put to practical use.

As stated above, a truly satisfactory system, which has a good storage stability and a high sensitivity, has not been proposed in either diazo-process photography or photopolymerization.

SUMMARY OF THE INVENTION

It is, accordingly, an object of the present invention to overcome problems in the prior art by providing a photosensitive composition having a high sensitivity and good stability over time in both diazo-process photography and photopolymerization.

In particular, the object of the present invention is to provide a novel photosensitive composition in which even an aromatic diazo compound such as a photodecomposable naphthoquinone, i.e., a compound traditionally regarded as one incapable of being spectrally sensitized by photodecomposition, is spectrally sensitized in an efficient way.

The photosensitive composition of the present invention comprising a polymerizable monomer, a photopolymerization initiator, and a diazonium salt compound containing an anion portion represented by the general formula (I-1), (I-2), or (II) given below:

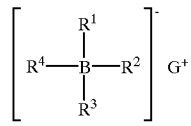

General formula (I-1)

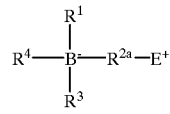

General formula (I-2)

wherein, in the general formulas (I-1) and (I-2), $R^1$ and $R^2$ each independently represent a phenyl group, an aromatic hydrocarbyl group that may contain a heteroatom and is a group other than the phenyl group, an alkyl group that has 1 to 20 carbon atoms and is substituted by —Si($R^9$)($R^{10}$)($R^{11}$), or a group represented by the formulae (ii), (iia), or (iib) given below, and the phenyl group and the aromatic hydrocarbyl group may each be substituted by a group selected from the group consisting of an alkyl group having 1 to 20 carbon atoms, an alkyl group having 2 to 20 carbon atoms and containing O, S(O)$_p$ or NR$^5$, OR$^6$, R$^6$S(O)$_p$, R$^6$SO$_3$, N(R$^7$)(R$^8$), R$^6$OCO, CON(R$^7$)(R$^8$), COR$^9$, Si(R$^9$)(R$^{10}$)(R$^{11}$), Sn(R$^9$)(R$^{10}$)(R$^{11}$), B(R$^{12}$)(R$^{13}$), a halogen atom, (R$^9$)(R$^{10}$)P(O)$_q$, and CN, so that at least one ortho position of the phenyl group and the aromatic hydrocarbyl group is substituted by a substituent group; and $R^{2a}$ represents a phenylene group or another divalent aromatic hydrocarbyl group that may contain a heteroatom, wherein the aromatic hydrocarbyl group may be substituted by a group selected from the group consisting of an alkyl group having 1 to 20 carbon atoms, an alkyl group having 2 to 20 carbon atoms and containing O, S(O)$_p$ or NR$^5$, OR$^6$, R$^6$S(O)$_p$, R$^6$SO$_3$, N(R$^7$)(R$^8$), R$^6$OCO, CON(R$^7$)(R$^8$) COR$^9$, Si(R$^9$)(R$^{10}$)

($R^{11}$), $Sn(R^9)(R^{10})(R^{11})$, $B(R^{12})(R^{13})$, a halogen atom, $(R^9)(R^{10})P(O)_q$, CN, and a group represented by the formula (a) given below:

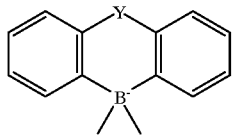

(ii)

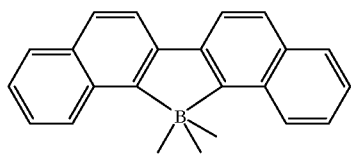

(iia)

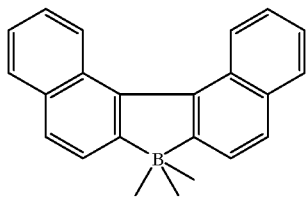

(iib)

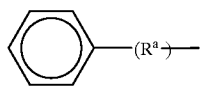

(a)

wherein, in the formula (a), $R^a$ represents an alkylene group, an alkyl group having 1 to 12 carbon atoms, an alkoxy group having 1 to 12 carbon atoms, or a substituted alkylene group bearing a substituent selected from the group consisting of $R^6OCO$, CN, and a halogen atom; and in the formulae (ii), (iia), and (iib), the aromatic ring may be substituted by a group selected from the group consisting of an alkyl group having 1 to 20 carbon atoms, an alkyl group having 2 to 20 carbon atoms and containing O, $S(O)_p$ or $NR^5$, $OR^6$, $R^6S(O)_q$, $R^6SO_3$, $N(R^7)(R^8)$, $R^6OCO$, $CON(R^7)(R^8)$, $COR^9$, $Si(R^9)(R^{10})(R^{11})$, $Sn(R^9)(R^{10})(R^{11})$, $B(R^{12})(R^{13})$, a halogen atom, $(R^9)(R^{10})P(O)_q$, and CN; and Y represents $(CH_2)_n$, $CH=CH$, CO, $NR^5$, O, $S(O)_p$, or a group represented by the formula given below:

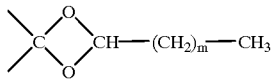

wherein, $R^3$ represents an alkyl group that has 1 to 20 carbon atoms and is substituted by $-Si(R^9)(R^{10})(R^{11})$, a phenyl group, or an aromatic hydrocarbyl group that is other than the phenyl group and may contain a heteroatom, and the phenyl group and the aromatic hydrocarbyl group may be substituted by a group selected from the group consisting of an alkyl group having 1 to 20 carbon atoms, an alkyl group having 2 to 20 carbon atoms and containing O, $S(O)_p$ or $NR^5$, $OR^6$, $R^6S(O)_p$, $R^6SO_3$, $N(R^7)(R^8)$, $R^6OCO$, $CON(R^7)(R^8)$, $COR^9$, $Si(R^9)(R^{10})(R^{11})$, $Sn(R^9)(R^{10})(R^{11})$, $B(R^{12})(R^{13})$, a halogen atom, $(R^9)(R^{10})P(O)_q$, and CN; and $R^4$ represents a group selected from the group consisting of a phenyl group, an aromatic hydrocarbyl group that is other than the phenyl group and may contain a heteroatom, an alkyl group having 1 to 20 carbon atoms, an alkyl group having 2 to 20 carbon atoms and containing O, $S(O)_p$ or $NR^5$, a cycloalkyl group having 3 to 12 carbon atoms, an alkenyl group having 2 to 8 carbon atoms, and a group represented by the formula (a) or (b) given below:

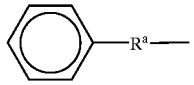

(a)

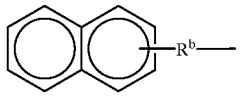

(b)

wherein, in the formulas (a) and (b), $R^a$ and $R^b$ each independently represent an alkylene group or a substituted alkylene group bearing a substituent selected from the group consisting of an alkyl group having 1 to 12 carbon atoms, an alkoxy group having 1 to 12 carbon atoms, $R^6OCO$, CN, and a halogen atom;

the substituent group represented by $R^4$ may be substituted by a group selected from the group consisting of $OR^6$, $R^6S(O)_p$, $R^6SO_3$, $N(R^7)(R^8)$, $R^6OCO$, $CON(R^7)(R^8)$, $COR^9$, $Si(R^9)(R^{10})(R^{11})$, $Sn(R^9)(R^{10})(R^{11})$, $B(R^{12})(R^{13})$, a halogen atom, $(R^9)(R^{10})P(O)_q$, and CN;

n is an integer of 0, 1, or 2; m is an integer of 2 or 3; p is an integer of 0, 1, or 2; and q is an integer of 0 or 1;

$R^5$ represents a hydrogen atom, an alkyl group having 1 to 12 carbon atoms, a phenyl group, or a group represented by the formula (a), wherein the phenyl group and the group represented by the formula (a) may be substituted by a group selected from the group consisting of an alkyl group having 1 to 6 carbon atoms, an alkoxy group having 1 to 12 carbon atoms, $R^6OCO$, CN, and a halogen atom; wherein $R^6$ represents an alkyl group having 1 to 12 carbon atoms and a phenyl group, each of which may be substituted by a halogen atom;

$R^7$ and $R^8$ each represent an alkyl group having 1 to 12 carbon atoms, a cycloalkyl group having 3 to 12 carbon atoms, a phenyl group, or a group represented by the formula (a), wherein the phenyl group and the group represented by the formula (a) may be substituted by a group selected from the group consisting of an alkyl group having 1 to 6 carbon atoms, an alkoxy group having 1 to 12 carbon atoms, $R^6OCO$, CN, and a halogen atom; and $R^7$ and $R^8$ may form together with a nitrogen atom to which $R^7$ and $R^8$ are linked a 5-membered or 6-membered ring, which may contain O or S;

$R^9$, $R^{10}$ and $R^{11}$ each independently represent an alkyl group having 1 to 12 carbon atoms, a cycloalkyl group having 3 to 12 carbon atoms, a phenyl group, or a group represented by the formula (a), wherein the phenyl group and the group represented by the formula (a) may be substituted by a group selected from the group consisting of an alkyl group having 1 to 6 carbon atoms, an alkoxy group having 1 to 12 carbon atoms, $R^6OCO$, CN, and a halogen atom;

$R^{12}$ and $R^{13}$ each represent the same groups as those defined for $R^9 \sim R^{11}$, provided $R^{12}$ and $R^{13}$ may form together with the boron atom to which $R^{12}$ and $R^{13}$ are linked a 5-membered or a 6-membered ring, which may contain O or S;

$R^{14}$, $R^{15}$ and $R^{16}$ each independently represent a group selected from the group consisting of an alkyl group having 1 to 12 carbon atoms, an alkenyl group having 2 to 12 carbon atoms, a cycloalkyl group having 3 to 12 carbon atoms, a phenyl group, and a group represented by the formula (a), wherein the alkyl group, the alkenyl group, and the cycloalkyl group may be substituted by $R^6OCO$ or CN; and the phenyl group and the group represented by the formula (a) may be substituted by a group selected from the group consisting of an alkyl group having 1 to 6 carbon atoms, an alkoxy group having 1 to 12 carbon atoms, $R^6OCO$, CN, and a halogen atom; and E represents $P(R^{14})(R^{15})$, $S(R^6)$, or $N(R^7)(R^8)$, wherein $R^6 \sim R^{15}$ are as previously defined; and General formula (II)

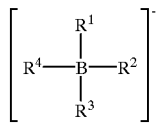

wherein, in the general formula (II), $R^1$ represents an alkyl group having 1 to 20 carbon atoms, a cycloalkyl group having 3 to 12 carbon atoms, an alkenyl group having 2 to 8 carbon atoms, or a group represented by the formula (a) or (b) given below, and the substituent group represented by $R^1$ may contain in the structure thereof O, $S(O)_p$, or $NR^5$ as a bridging group;

(a)

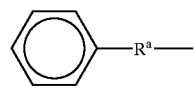

(b)

wherein, in the formulas (a) and (b), $R^a$ and $R^b$ each independently represent an alkylene group or a substituted alkylene group bearing a substituent selected from the group consisting of an alkyl group having 1 to 12 carbon atoms, an alkoxy group having 1 to 12 carbon atoms, $R^6OCO$, CN, and a halogen atom, wherein $R^6$ is as previously defined;

the substituent group represented by $R^1$ may be further substituted by a group selected from the group consisting of an alkyl group having 1 to 20 carbon atoms, $OR^6$, $R^7S(O)_p$, $R^7SO_3$, $N(R^8)(R^9)$, $Si(R^{10})(R^{11})(R^{12})$, $B(R^{13})(R^{14})$, a halogen atom, and $(R^{15})(R^{16})P(O)_q$; and $R^2 \sim R^4$ each independently represent a phenyl group or a biphenyl group; wherein the substituent groups represented by $R^2 \sim R^4$ may be further substituted by a group selected from the group consisting of an alkyl group having 1 to 20 carbon atoms (this alkyl group may be substituted by $OR^6$, $N(R^8)(R^9)$, or a halogen atom), $OR^6$, $R^7Si(O)_p$, $R^7SO_3$, $N(R^8)(R^9)$, $Si(R^{10})(R^{11})(R^{12})$, $B(R^{13})(R^{14})$, a halogen atom, $(R^{15})(R^{16})P(O)_q$, and a group represented by the formula given below:

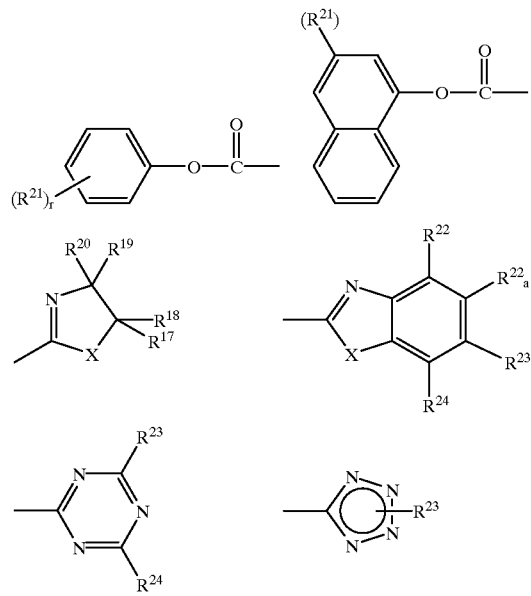

wherein, the sum of Hammett σ constants of $R^2 \sim R^4$ is $+0.36 \sim +2.58$;

X represents O, S, or $NR^2$;

$R^5$ may be a hydrogen atom, an alkyl group having 1 to 12 carbon atoms, or the substituent group represented by the formula (a), wherein the substituent group represented by the formula (a) may have on the phenyl ring thereof a substituent selected from the group consisting of an alkyl group having 1 to 6 carbon atoms, an alkoxy group having 1 to 12 carbon atoms, and a halogen atom;

$R^6 \sim R^7$ each independently represent a group selected from the group consisting of an alkyl group, which has 1 to 12 carbon atoms and may be substituted by a halogen atom, a phenyl group, and the group represented by the formula (a), wherein the phenyl group and the substituent group represented by the formula (a) may each have on the phenyl ring thereof a substituent selected from the group consisting of an alkyl group having 1 to 6 carbon atoms, an alkoxy group having 1 to 12 carbon atoms, and a halogen atom;

$R^8 \sim R^{16}$ each independently represent a group selected from the group consisting of an alkyl group having 1 to 12 carbon atoms, a cycloalkyl group having 3 to 12 carbon atoms, a phenyl group, and the group represented by the formula (a), wherein the phenyl group and the substituent group represented by the formula (a) may each have on the phenyl ring thereof a substituent selected from the group consisting of an alkyl group having 1 to 6 carbon atoms, an alkoxy group having 1 to 12 carbon atoms, and a halogen atom;

$R^8 \sim R^9$ may form together with the nitrogen atom to which $R^8$ and $R^9$ are linked an aliphatic 6-membered ring, which may further contain another heteroatom, such as O or S;

$R^{17} \sim R^{20}$ each independently represent a group selected from the group consisting of hydrogen, an alkyl group that has 1 to 12 carbon atoms and may be substituted by an alkoxy group having 1 to 12 carbon atoms, a phenyl group, and a group represented by the formula (a), wherein the phenyl group and the substituent group represented by the formula (a) may each have on the phenyl ring thereof a substituent selected from the group consisting of an alkyl group having 1 to 6 carbon atoms, an alkoxy group having 1 to 12 carbon atoms, and a halogen atom;

$R^{21}$ represents a hydrogen atom or an alkyl group having 1 to 12 carbon atoms;

$R^{22}$~$R^{24}$ each independently represent a group selected from the group consisting of: hydrogen; an alkyl group that has 1 to 12 carbon atoms and may be substituted by an alkoxy group having 1 to 12 carbon atoms, an hydroxy group, or a halogen atom; and a phenyl group that may be substituted by an alkoxy group having 1 to 12 carbon atoms, an hydroxy group, or a halogen atom; and q is an integer of 0 to 1, and r is an integer of 0 to 5.

In the photosensitive composition of the above-mentioned embodiment, the anionic component, which is the anionic component represented by the general formula (I-1), (I-2), or (II) and which constitutes part of the diazonium salt compound, and the cationic component, which constitutes part of the diazonium compound, are both sensitized by a specific wavelength within an ultraviolet light region. As a result, both components of the diazonium salt compound act as a polymerization initiator. Therefore, when the above-mentioned diazonium salt compound and the photopolymerization initiator, which absorbs rays in a visible light region, are used in a combination in the photosensitive composition, the sensitivity of the photosensitive composition is increased. This is presumably because the range of the wavelengths of light absorbed by the composition extends into the visible light region and because the reaction to be caused by the polymerization initiator is accelerated.

Alternatively, the photosensitive composition of the present invention comprises a polymerizable monomer, a diazonium salt compound, and a compound represented by the general formula (III-1), (III-2), or (IV) given below:

General formula (III-1)

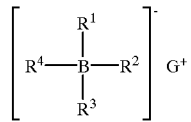

General formula (III-2)

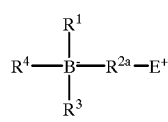

wherein, in the general formulas (III-1) and (III-2), $R^1$, $R^2$, $R^{2a}$, $R^3$, $R^4$, and E are the same as those defined in the general formulas (I-1) and (I-2); and G represents a group capable of forming a cation;

General formula (IV)

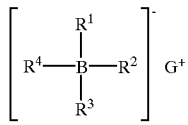

wherein, in the general formula (IV), $R^1$, $R^2$, $R^3$, and $R^4$ are the same as those defined in the general formula (I-1); and G represents a group capable of forming a cation.

In the above-mentioned embodiment, a diazonium salt compound and the specific, organic borate compound are added as separate compounds to the photosensitive composition. In this embodiment, the compound, which is represented by the general formula (III-1), (III-2), or (IV), itself has a function as a photopolymerization initiator. When the compound, which is represented by the general formula (III-1), (III-2), or (IV), is used in combination with the diazonium salt compound, the combination is considered to perform the same function as that of the aforementioned diazonium salt compound comprising an anionic component having a specific borate structure. Presumably because of this function, the sensitivity of the photosensitive composition is increased.

DETAILED DESCRIPTION OF THE PREFERRED EMBODIMENTS

Further details of the present invention are given below.

Compounds that form the photosensitive composition of the present invention are explained below.

A photosensitive composition comprises a diazonium salt compound having a specific, anionic component. The diazonium salt compound is a compound that has an anionic component represented by the general formula (I-1), (I-2), or (II). Because of this compound, the photosensitive composition of the present invention is stable and capable of imaging with high sensitivity.

Of the diazonium salt compounds having an anionic component represented by the general formula (I-1) or (I-2), i.e., of diazo dye/specific borate anion complexes for use in the photosensitive composition of the present invention, the specific borate anion component is explained below.

The compound having an anionic component represented by the general formula (I-1) can be obtained by, for example, reacting a triorganylborane (A) with an organometallic reagent, e.g., an alkyllithium compound or a Grignard reagent.

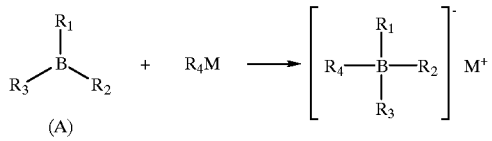

(A)

M represents, for example, an alkali metal (e.g., Li or Na) or MgX (where X represents a halogen atom, particularly Br). Alternatively, the compound having the anionic component represented by the general formula (I-1) can be obtained by, for example, reacting an alkyldihaloborane, an alkyldialkoxyborane, or an alkyldiaryloxyborane (B) with an organometallic reagent, e.g., a Grignard reagent or a lithium organyl compound.

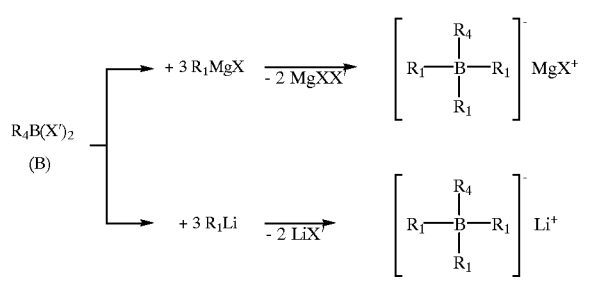

In the above formulas, X represents a halogen atom, particularly Br, and X' represents a halogen atom, an alkoxy group, or an aryloxy group. Other groups are as previously defined. In the general formula (III-1), G is a positive group other than lithium or magnesium. These compounds can be obtained by, for example, a cation-exchanging reaction.

The compound having an anionic component represented by the general formula (I-2) can be obtained by, for example, one of the above-described methods, wherein the borate is produced by reacting a triorganylborane which is substituted by a group E which is as previously defined.

In the reactions involving organometallic compounds, the conditions for the reaction are known to persons skilled in the art. Accordingly, the reactions are carried out in an inert organic solvent such as ether, an aliphatic hydrocarbon, or the like. Specific, advantageous examples of the solvent include diethyl ether, tetrahydrofuran, and hexane. An example of the organometallic reagent suited for the preparation of the borate is a lithium compound having a corresponding aliphatic or aromatic hydrocarbyl group. The preparation of the Grignard reagent is known to persons skilled in the art and described widely in textbooks and other publications. The reactions involving organometallic compounds are carried out preferably in a vacuum or in an atmosphere of an inert gas such as nitrogen. Generally, the reactions are carried out at or below 0° C., and then the temperature is raised to room temperature. From the standpoint of reaction efficiency, it is advantageous to stir the reaction mixture. Upon completing the reaction, the reaction product is separated and then purified according to a known method, e.g., chromatography, recrystallization, or the like.

A compound, whose anionic component is the anionic group of the above-mentioned borate compound and whose cationic component is the cationic group of a diazonium salt as described in the present invention, is produced by effecting a cation-exchanging reaction between a corresponding borate and diazonium salt. Examples of the borate suited for the cation exchange include lithium borate, magnesium borate, sodium borate, ammonium borate, and a tetraalkylammonium borate.

An example of the preparation of alkyldiarylborane as a triorganylborane (A) for use in the synthesis of the above-mentioned compound to be used in the present invention is described in, e.g., Tetrahedron 1993, 49, 2965. The synthesis of the triarylborane is described in J. Organomet. Chem. 1972, 38, 229, J. Organomet. Chem. 1981, 209, 1, J. Amer. Chem. Soc. 1957, 79, 2302, and Chem. Ber. 1955, 88, 962. The alkyldihaloborane (B) can be prepared according to the scheme described in, e.g., JACS 1977, 99, 7097 and U.S. Pat. No. 3,083,288. The method for preparing the compound (B) is also described in Zh. Obshch. Khim. 1959, 29, 3405 and Bull. Chim. Soc. France, 1967, 11, 4160. The preparation of phenyldifluoroborane is described in J. Organomet. Chem. 1972, 35, 9. Tris(trimethylsilylmethyl)borane can be prepared by the method described in, e.g., J. Amer. Chem. Soc. 1959, 81, 1844. The borane, which is necessary as a starting material for the preparation of the borate compound useful as the counter anion component of the diazonium salt of the present invention, can be prepared by, for example, one of the methods described in the above-mentioned references.

Specific examples of the anionic component for use in the present invention and represented by the general formula (I-1) or (I-2) are shown in Tables 1~3 by specifying the functional groups. However, it must be noted that the present invention is not limited to these examples.

TABLE 1

| Example | $R^1$ | $R^2$ | $R^3$ | $R^4$ |
| --- | --- | --- | --- | --- |
| I-1a | mesityl | mesityl | phenyl | methyl |
| I-1b | mesityl | mesityl | phenyl | butyl |
| I-2a | bromomesityl | bromomesityl | phenyl | methyl |
| I-3a | dichloromesityl | dichloromesityl | phenyl | methyl |
| I-3b | dichloromesityl | dichloromesityl | phenyl | butyl |
| I-4a | chloromesityl | chloromesityl | phenyl | methyl |
| I-4b | chloromesityl | chloromesityl | phenyl | butyl |
| I-5a | mesityl | mesityl | p-fluorophenyl | methyl |
| I-5b | mesityl | mesityl | p-fluorophenyl | butyl |
| I-6a | mesityl | mesityl | m-fluorophenyl | methyl |
| I-6b | mesityl | mesityl | m-fluorophenyl | butyl |
| I-7a | mesityl | mesityl | 3,4-difluorophenyl | methyl |
| I-8a | mesityl | mesityl | 3,5-difluorophenyl | methyl |
| I-9a | mesityl | mesityl | 3,5-bis(trifluoromethyl)phenyl | methyl |
| I-9b | mesityl | mesityl | 3,5-bis(trifluoromethyl)phenyl | butyl |
| I-10a | mesityl | mesityl | 3-bromo-5-fluorophenyl | methyl |

TABLE 2

| Example | $R^1$ | $R^2$ | $R^3$ | $R^4$ |
| --- | --- | --- | --- | --- |
| I-11a | mesityl | mesityl | p-chlorophenyl | methyl |
| I-11b | mesityl | mesityl | p-chlorophenyl | butyl |
| I-12a | mesityl | mesityl | m-chlorophenyl | methyl |
| I-12b | mesityl | mesityl | m-chlorophenyl | butyl |
| I-13a | mesityl | mesityl | p-bromophenyl | methyl |
| I-14a | chloromesityl | chloromesityl | p-bromophenyl | methyl |
| I-15a | mesityl | mesityl | 2,5-dimethyl-4-bromophenyl | methyl |
| I-16a | mesityl | mesityl | mesityl | methyl |
| I-17a | p-chloroduryl | p-chloroduryl | phenyl | butyl |

TABLE 2-continued

| Example | R¹ | R² | R³ | R⁴ |
|---|---|---|---|---|
| I-17b | p-chloroduryl | p-chloroduryl | butyl | methyl |
| I-18a | o-tolyl | o-tolyl | o-tolyl | methyl |
| I-18b | o-tolyl | o-tolyl | o-tolyl | butyl |
| I-19a | o-methoxyphenyl | o-methoxyphenyl | o-methoxyphenyl | butyl |
| I-20a | mesityl | mesityl | butyl | methyl |
| I-21a | mesityl | mesityl | $(CH_3)_3$—SiCH$_2$— | methyl |
| I-22a | mesityl | mesityl | phenyl | phenyl |
| I-22b | mesityl | mesityl | phenyl | phenyl |
| I-23a | $(CH_3)_3$—Si—CH$_2$— | $(CH_3)_3$—Si—CH$_2$— | $(CH_3)_3$—SiCH$_2$— | $(CH_3)_3$—Si—CH$_2$— |

TABLE 3

| Example | R¹ | R² | R³ | R⁴ |
|---|---|---|---|---|
| I-23b | $(CH_3)_3$—Si—CH$_2$— | $(CH_3)_3$—Si—CH$_2$— | $(CH_3)_3$—SiCH$_2$— | $(CH_3)_3$—Si—CH$_2$— |
| I-23c | $(CH_3)_3$—Si—CH$_2$— | $(CH_3)_3$—Si—CH$_2$— | $(CH_3)_3$—SiCH$_2$— | $(CH_3)_3$—Si—CH$_2$— |
| I-23d | $(CH_3)_3$—Si—CH$_2$— | $(CH_3)_3$—Si—CH$_2$— | $(CH_3)_3$—SiCH$_2$— | $(CH_3)_3$—Si—CH$_2$— |
| I-23e* | $(CH_3)_3$—Si—CH$_2$— | $(CH_3)_3$—Si—CH$_2$— | $(CH_3)_3$—SiCH$_2$— | methyl |
| I-24a | chloromesityl | chloromesityl | chloromesityl | methyl |
| I-24b | chloromesityl | chloromesityl | chloromesityl | butyl |
| I-25a | dichloromesityl | dichloromesityl | dichloromesityl | methyl |
| I-26a | m-tolyl | m-tolyl | m-tolyl | methyl |
| I-27a | p-tolyl | p-tolyl | p-tolyl | methyl |
| I-28a | mesityl | mesityl | o-tolyl | methyl |
| I-29a | mesityl | mesityl | p-dimethylaminophenyl | methyl |
| I-32a | mesityl | mesityl | mesityl | methyl |
| I-33a | dichloromesityl | dichloromesityl | 4'-bromo-biphenyl | methyl |
| I-34a*1 | mesityl | mesityl | 9-phenanthryl | butyl |
| I-35a | mesityl | mesityl | 1-naphthyl | methyl |
| I-35b | mesityl | mesityl | 1-naphthyl | butyl |

*The compound of Example 23e is a mixture comprising the compound of Example 23a, tetramethylammonium methyl-tris (trimethylsilylmethyl) borate, and tetramethylammonium dimethyl-bis (trimethylsilylmethyl) borate at a ratio of 3:10:1.

Next, another anionic component, i.e., the anionic component represented by the general formula (II), of the diazonium salt for use in the photosensitive composition of the present invention is explained below.

The compound having an anionic component represented by the general formula (II) can be obtained by, for example, reacting a triorganylborane (A) represented by the following general formula with an organometallic reagent, e.g., an alkyllithium compound or a Grignard reagent.

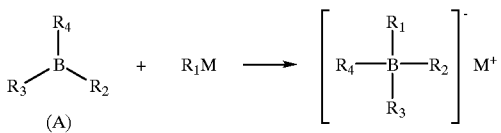

(In the above formulas, M represents, for example, an alkali metal, such as Li or Na, or otherwise MgX where X represents a halogen atom, particularly Br.) Alternatively, the compound having the anionic component represented by the general formula (II) can be obtained by, for example, reacting an alkyldihaloborane and/or an alkyldialkoxyborane, or an alkyldiaryloxyborane (B) with an organometallic reagent, e.g., a Grignard reagent or an organotin compound, as shown by the following formulas.

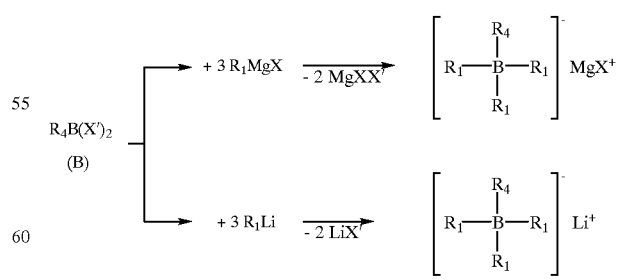

(In the above formulas, X represents a halogen atom, particularly Br, and X' represents a halogen atom, an alkoxy group, or an aryloxy group, while other groups are as previously defined.)

The reactions involving these organometallic compounds are carried out under the same conditions as in the preparation of the anionic component represented by the general formula (I-1) or (I-2). Further, the method whereby the anionic component represented by the general formula (II) is incorporated into a diazonium salt as an anionic component thereof is carried out in the same way as previously described. That is, the reaction is carried out by effecting the cation-exchanging reaction between the corresponding borate and diazonium salt.

An example of preparation of a triorganylborane (A) for use in the synthesis of the above-mentioned compound to be used in the present invention is described in, e.g., Chem. Ber. 1955, 88, 962. Pathways for synthesis of some alkyldihaloboranes (B) are described in, e.g., JACS 1977, 99, 7097, U.S. Pat. No. 3,083,288, and Zh. Obshch. Khim. 1959, 29, 3405. A method for preparing this compound is also described in Bull. Chim. Soc. France, 1967, 11, 4160. The borane, which is necessary as a starting material for the preparation of the borate compound useful as the counter anion component of the diazonium salt of the present invention, can be prepared by, for example, one of the methods described in the above-mentioned references.

Specific examples of the anionic component for use in the present invention and represented by the general formula (II) are shown in Tables 4~6 by specifying the functional groups. However, it must be noted that the present invention is not limited to these examples.

TABLE 4

| Example | $R^1$ | $R^2$–$R^4$ (same) |
|---|---|---|
| II-1 | butyl | 2,6-difluorophenyl |
| II-2 | hexyl | 4-chlorophenyl |
| II-3 | hexyl | 3-trifluoromethylphenyl |
| II-4*[7] | butyl | 3-fluorophenyl |
| II-5 | hexyl | 3-fluorophenyl |
| II-5a | ethyl | 3-fluorophenyl |
| II-5b | ethyl | 3-fluorophenyl |
| II-6 | hexyl | 3-fluorophenyl |
| II-7 | hexyl | 3-fluorophenyl |
| II-8 | hexyl | 3,5-difluorophenyl |
| II-9 | methyl | 2-(trifluoromethyl)phenyl |

TABLE 4-continued

| Example | $R^1$ | $R^2$–$R^4$ (same) |
|---|---|---|
| II-10 | butyl | 2-(trifluoromethyl)phenyl |
| II-11 | butyl | 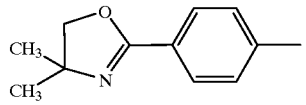 |
| II-12 | methyl | 4-bromophenyl |
| II-13 | hexyl | 3-chlorophenyl |
| II-14 | hexyl | 4-bromophenyl |
| II-15 | butyl | 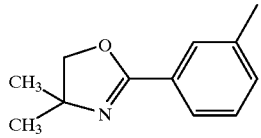 |
| II-16 | benzyl | m-fluorophenyl |
| II-17 | hexyl | m-fluorophenyl |

TABLE 5

| Example | $R^2$ | $R^1$, $R^3$, $R^4$ (same) |
|---|---|---|
| II-18 | hexyl | m-fluorophenyl |
| II-19 | hexyl | m-fluorophenyl |
| II-20 | hexyl | m-fluorophenyl |
| II-21 | hexyl | m-fluorophenyl |
| II-22 | hexyl | m-fluorophenyl |
| II-23 | hexyl | m-phenoxyphenyl |
| II-24 | hexyl | p-(diisopropylaminosulfonyl)phenyl |
| II-25 | hexyl | p-(2,6-di-tert-butyl-4-methylphenoxycarbonyl)phenyl |
| II-26 | hexyl | p-(diisopropylaminocarbonyl)phenyl |
| II-27 | methyl | dichloromesityl |

TABLE 6

| Example | $R^1$ | $R^2$ | $R^3$ | $R^4$ |
|---|---|---|---|---|
| II-28 | butyl | p-bromophenyl | mesityl | mesityl |
| II-29 | butyl | p-fluorophenyl | mesityl | mesityl |
| II-30 | p-methylbenzyl | p-chlorophenyl | mesityl | mesityl |
| II-31 | hexyl | phenyl | o-methylphenyl | p-chlorophenyl |
| II-32 | allyl | m-fluorophenyl | m-fluorophenyl | m-fluorophenyl |
| II-33 | p-methylbenzyl | m-fluorophenyl | m-fluorophenyl | m-fluorophenyl |
| II-34 | α-methylbenzyl | m-fluorophenyl | m-fluorophenyl | m-fluorophenyl |

Borate compounds having the above-mentioned anionic components and specific borate compounds are described in, for example, JP-A Nos. 9-188,685 and 9-188,686.

The diazonium salt compound for use in the photosensitive composition described in claim 1 of the present invention is a compound represented by the following general formula:

(where Ar represents an aromatic portion), wherein the compound has the borate component, which is represented by the general formula (I-1) or (I-2), in place of the acid anionic part represented by $X^-$.

When heated, the diazonium salt compound is caused to react with a coupler to thereby develop a color. The diazonium salt compound is also decomposed by light. The maximum wavelength to be absorbed by the diazonium salt compound can be controlled by the position or the kind of the substituent group of the Ar part.

In the above-described general formula, Ar represents a substituted or unsubstituted aryl group. Examples of the substituent group include alkyl, alkoxy, alkylthio, aryl, aryloxy, arylthio, acyl, alkoxycarbonyl, carbamoyl, carboamido, sulfonyl, sulfamoyl, sulfonamide, ureido, halogen, amino, and heterocyclic groups. These substituent groups may be further substituted.

The aryl group is preferably an aryl group having 6 to 30 carbon atoms. Some illustrative nonlimiting examples of the aryl group include phenyl, 2-methylphenyl, 2-chlorophenyl, 2-methoxyphenyl, 2-butoxyphenyl, 2-(2-ethylhexyloxy) phenyl, 2-octyloxyphenyl, 3-(2,4-di-t-pentylphenoxyethoxy)phenyl, 4-chlorophenyl, 2,5-dichlorophenyl, 2,4,6-trimethylphenyl, 3-chlorophenyl, 3-methylphenyl, 3-methoxyphenyl, 3-butoxyphenyl, 3-cyanophenyl, 3-(2-ethylhexyloxy)phenyl, 3,4-dichlorophenyl, 3,5-dichlorophenyl, 3,4-dimethoxyphenyl, 3-(dibutylaminocarbonylmethoxy)phenyl, 4-cyanophenyl, 4-methylphenyl, 4-methoxyphenyl, 4-butoxyphenyl, 4-(2-ethylhexyloxy)phenyl, 4-benzylphenyl, 4-aminosulfonylphenyl, 4-N,N-dibutylaminosulfonylphenyl, 4-ethoxycarbonylphenyl, 4-(2-ethylhexyloxycarbonyl)phenyl, 4-fluorophenyl, 3-acetylphenyl, 2-acetylaminophenyl, 4-(4-chlorophenylthio)phenyl, 4-(4-methylphenyl)thio-2,5-butoxyphenyl, and 4-(N-benzyl-N-methylamino)-2-dodecyloxycarbonylphenyl. These groups may be further substituted by a substituent such as an alkyloxy, alkylthio, substituted phenyl, cyano, or substituted amino group, halogen, or a heterocyclic ring.

Specific examples of the cation portion of the diazonium salt compound suited for use in the present invention are given below. However, it must be noted that the present invention is not limited to these examples.

(2)-1
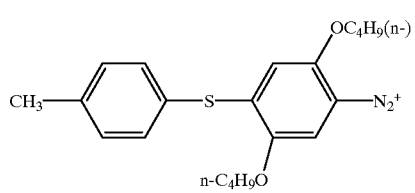

(2)-2
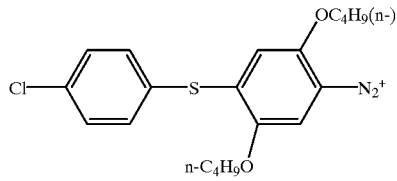

(2)-3
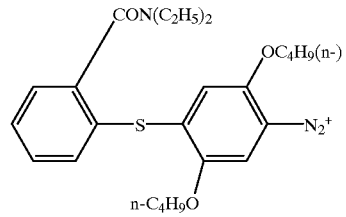

(2)-4
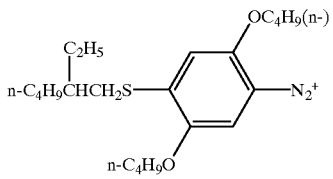

(3)-1
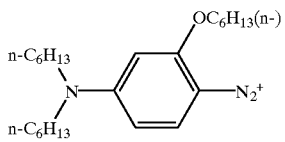

(3)-2
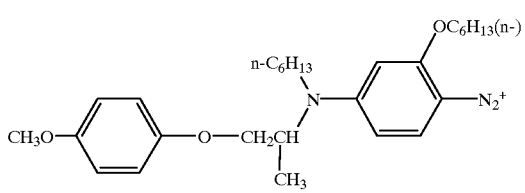

(3)-3
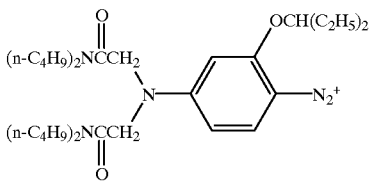

(3)-4
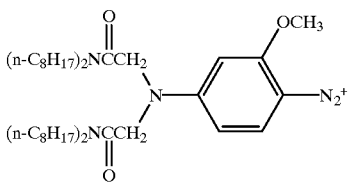

(3)-5
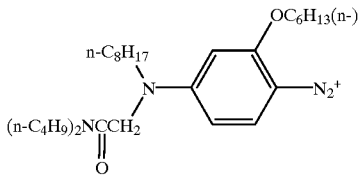

(3)-6 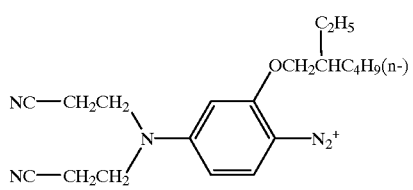

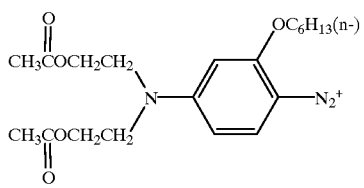

(3)-7 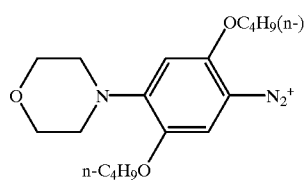

(3)-8

(3)-9 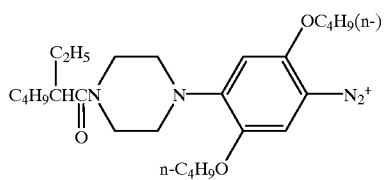

(3)-10 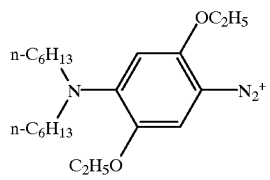

(4)-1 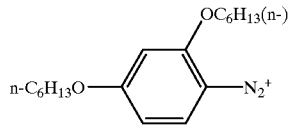

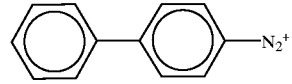

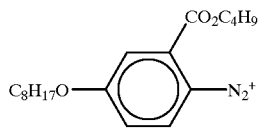

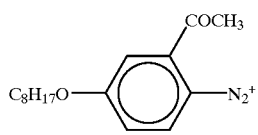

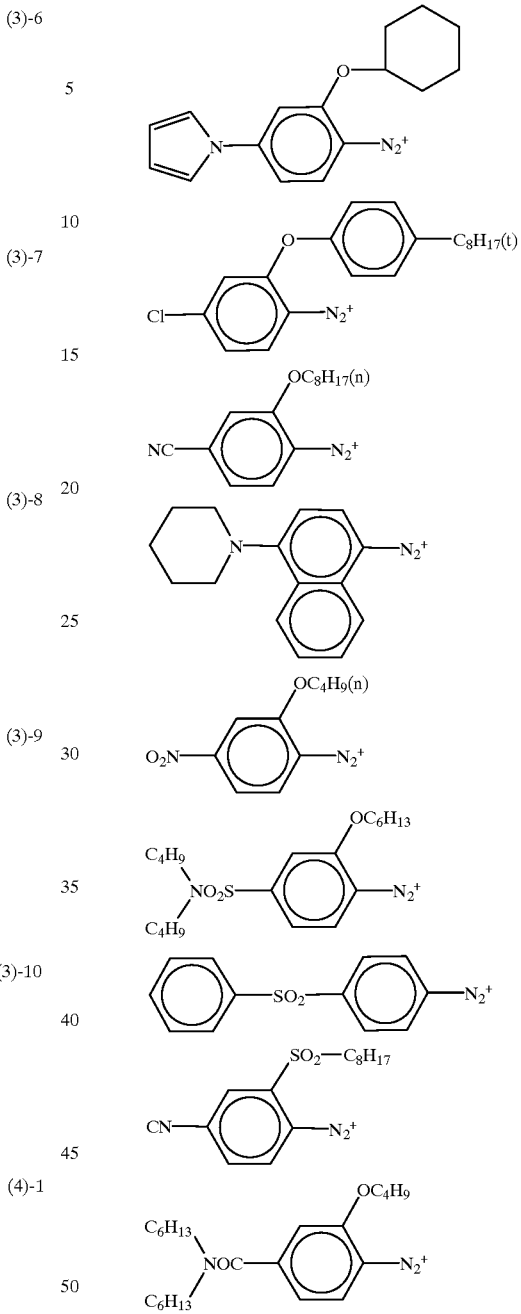

Further, the diazonium salt compound represented by the following general formula can also be used in the photosensitive composition of the present invention:

$$Ar-N_2^+X^-$$

(where Ar represents an aromatic portion and $X^-$ represents an acid anion).

The cation portion represented by $Ar-N_2^+$ is as previously described. $X^-$ represents an acid anion, examples of which include a polyfluoroalkylcarboxylic acid having 1 to 9 carbon atoms, a polyfluoroalkylsulfonic acid having 1 to 9 carbon atoms, boron tetrafluoride, tetraphenylboron, hexafluorophosphoric acid, an aromatic carboxylic acid, an aromatic sulfonic acid, and the like. Among these examples, hexafluorophosphoric acid is preferable from the standpoint of crystallinity.

Specific examples of the diazonium salt compound for use in the present invention are given below. However, it must be noted that the present invention is not limited to these examples.

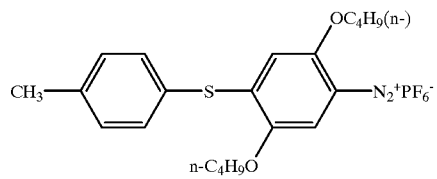
(2')-1

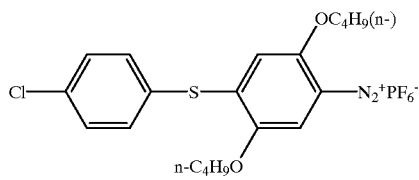
(2')-2

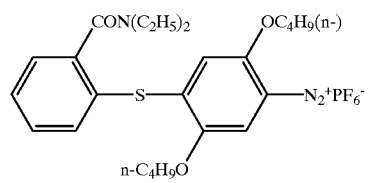
(2')-3

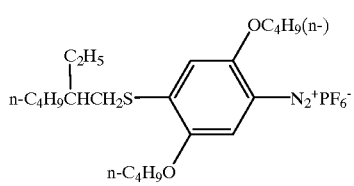
(2')-4

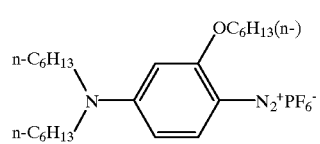
(3')-1

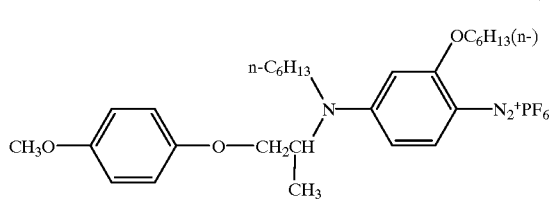
(3')-2

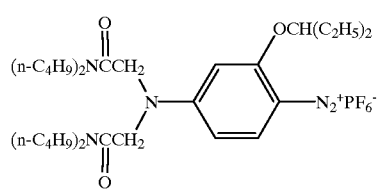
(3')-3

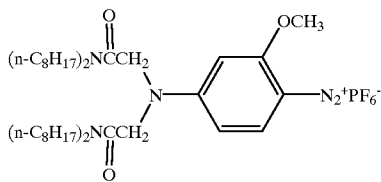
(3')-4

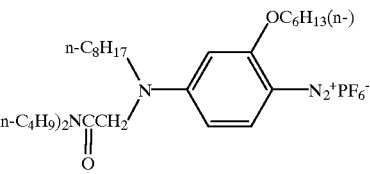
(3')-5

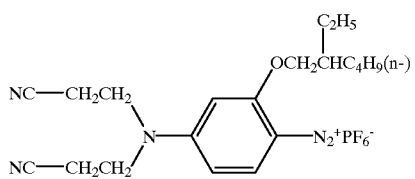
(3')-6

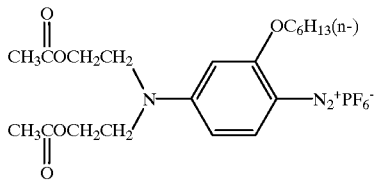
(3')-7

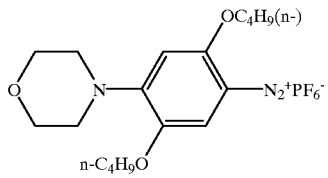
(3')-8

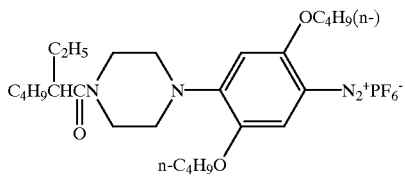
(3')-9

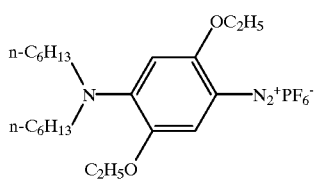
(3')-10

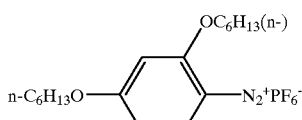
(4')-1

In the present invention, the diazonium salt compounds may be used singly or in a combination of two or more according to purposes such as adjustment of hue.

When a photosensitive layer is made from the photosensitive composition of the present invention, the contained amount of the specific diazonium salt compound in the photosensitive layer is preferably in the range of from 0.01 to 3 g/m², and more preferably in the range of from 0.02 to 1.0 g/m².

The complex that constitutes the diazonium salt compound includes a complex in which two or more dye (diazonium dye) cation clusters are complexed by two or more borate anion components.

Further, the photosensitive composition of the present invention preferably contains a compound represented by the general formula (III-1), (III-2), or (IV) together with a general-purpose diazonium salt compound in place of the aforementioned diazonium salt compound having a specific borate anionic component.

Next, the compound represented by the general formula (III-1) or (III-2) is explained.

As in the case of the compound having an anionic component represented by the general formula (I-1), the compound represented by the general formula (III-1) can be obtained by, for example, reacting a triorganylborane (A) with an organometallic reagent, e.g., an alkyllithium compound or a Grignard reagent.

In the general formula (III-1), G is a positive group other than lithium or magnesium, and these compounds can be obtained by, for example, a cation-exchanging reaction.

G is preferably ammonium or tetraalkylammonium. Particularly preferred examples of the tetraalkylammonium include tetramethylammonium, tetrabutylammonium, and the like. In addition, a trisalkylammonium ion, such as trimethylammonium, is also suitable. Also suitable are phosphonium and ammonium counter ions represented by the formulas: $^+P(R_w)(R_x)(R_y)(R_z)$ and $^+N(R_w)(R_x)(R_y)(R_z)$, respectively, where $R_w$, $R_x$, $R_y$, and $R_z$ each independently represent a group selected from the group consisting of hydrogen, unsubstituted or substituted alkyl, cycloalkyl, alkenyl, phenyl, and arylalkyl groups. Examples of the alkyl, cycloalkyl, alkenyl, phenyl, and arylalkyl groups are, respectively, a halide group, a hydroxyl group, a heterocycloalkyl group (e.g., epoxy, aziridyl, oxetanyl, furanyl, pyrrolidinyl, pyrrolyl, thiophenyl, tetrahydrofuranyl, or the like), a dialkylamino group, an amino group, a carboxyl group, an alkylcarbonyl group, an arylcarbonyl group, an aryloxy group, and an alkoxycarbonyl group.

The tetravalent nitrogen atom may be part of a 5-membered or 6-membered ring, wherein the ring may be fused with another ring. The ring may contain a heteroatom such as S, N, or O. The tetravalent nitrogen atom may be part of a polycyclic structure such as azonia propellane. The polycyclic structure may also contain a heteroatom such as S, N, or O.

A polyammonium salt and a polyphosphonium salt, particularly bis-salts, are also suited for use in the present invention. The bis-salts may have the same substituent groups as those described for the above-mentioned mono-salts.

When G is an ammonium or phosphonium ion, the ion may be substituted by a neutral dye such as thioxanthene, thioxanthone, coumarin, or ketocoumarin. Such an ion can be obtained by a reaction between an ammonium or phosphonium salt substituted by a reactive group (e.g., epoxy, amino, hydroxyl, or the like) and an appropriate derivative of the neutral dye. A corresponding example is described in European Patent No. 224,967 (Quantacure QTX).

Likewise, an ammonium or phosphonium ion may be substituted by a colorless electron-acceptive compound (e.g., benzophenone). These examples can be illustrated by the following formulas.

Quantacure ABQ:

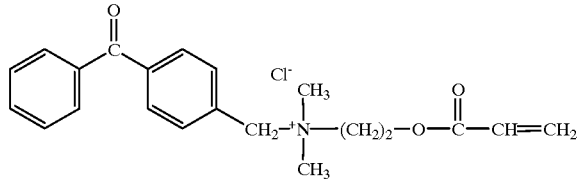

Quantacure BPQ:

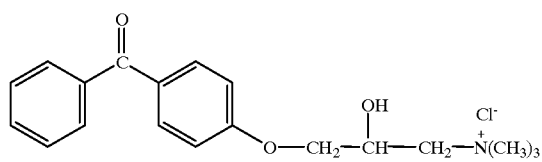

Quantacure BTC:

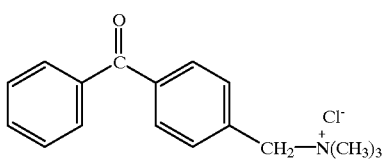

These electron acceptive compounds can be obtained from International Biosynthetics.

Other important quaternary ammonium compounds are, for example, trimethylcetylammonium and cetylpyridinium compounds.

Other examples usable as counter cation G⁺ are illustrated below by structural formulas.

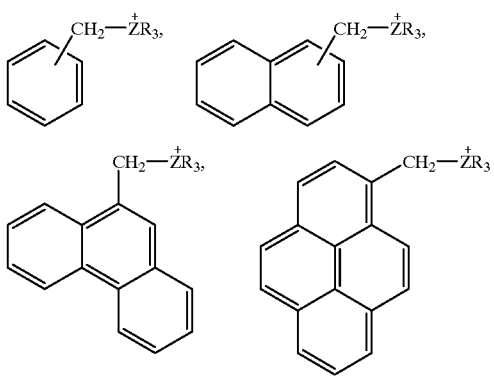

where Z represent P, S, or N; and R represents an alkyl group or an aryl group.

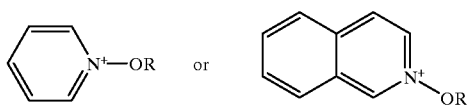

The above-described compound is also suitable, and is described in J. Polym. Sci. Part A: Polymer Chem. 1992, 30, 1987 and Polymer 1993, 34(6), 1130.

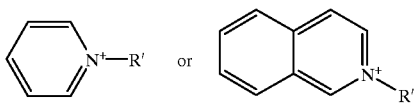

where R' represents an unsubstituted or substituted benzyl or phenacyl group. This compound is described in JP-A No. 7-70,221. In these compounds, the pyridinium aromatic ring may also have a substituent group which is previously defined.

In the present invention, tetraalkylammonium, i.e., ammonium having 4 alkyl groups which each have 1 to 4 carbon atoms, refers to the ions represented by the formulas given below.

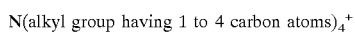

where the alkyl groups having 1 to 4 carbon atoms may be the alkyl groups having a corresponding number of carbon atoms as previously defined)

Examples of suitable ammonium ions include tetramethylammonium, tetraethylammonium, tetrapropylammonium, and tetrabutylammonium ions, particularly tetramethylammonium and tetrabutylammonium ions. Benzyl-tri(alkyl group having 1 to 4 carbon atoms) ammonium is $C_6H_4$—$CH_2$—N(alkyl group having 1 to 4 carbon atoms)$_3^+$, specific examples of which include benzyltrimethylammonium, benzyltriethylammonium, benzyltripropylammonium, and benzyltributylammonium ions, particularly benzyltrimethylammonium and benzyltributylammonium ions.

Other examples of the cationic component $G^+$ include onium ions such as iodonium and sulfonium ions. Examples of such counter ions include the ions represented by the following formulas as described in European Patent Application Laid-Open Nos. 555,058 and 690,074.

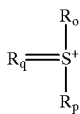

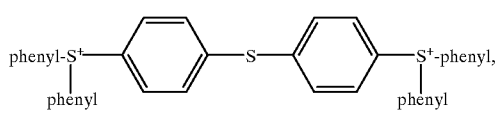

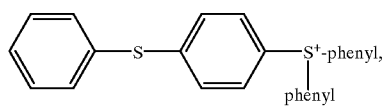

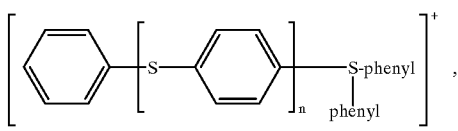

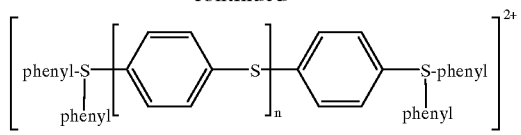

Examples of other suitable counter ions include those represented by the following structural formulas:

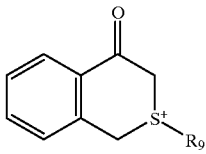

where $R_g$ represents an alkyl group, particularly an ethyl or benzyl group.

In the formula, the aromatic ring may have a substituent group such as those previously defined or the like.

Other examples of suitable counter ions include onium ions such as halonium ions, particularly diaryliodonium ions as described in European Patent Application Laid-Open Nos. 334,056 and 562,897.

Further examples of suitable counter ions include the cation of the ferrocenium salt as described in European Patent No. 949,145 and European Patent Application Laid-Open No. 109,851.

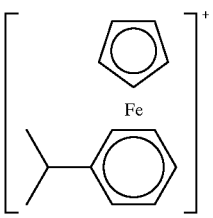

Additional suitable examples of onium cations, such as ammonium, phosphonium, sulfonium, iodonium, selenonium, arsonium, telluronium, and bismuthonium, are disclosed in, e.g., JP-A No.6-266,102.

Examples of cationic transition metal complex ions suitable as counter ions for use in the present invention are described in, e.g., U.S. Pat. No. 4,954,414. Particularly preferred specific examples are bis(2,2'-bipyridine)(4,4'-dimethyl-2,2'-bipyridine)ruthenium, tris(4,4'-dimethyl-2,2'-bipyridine)ruthenium, tris(4,4'-dimethyl-2,2'-bipyridine) iron, tris(2,2',2"-terpyridine)ruthenium, tris(2,2'-bipyridine) ruthenium, and bis(2,2'-bipyridine)(5-chloro-1,10-phenanthroline)ruthenium.

The compounds represented by the general formula (III-2) can be obtained by converting a triorganylborane, which is substituted by the aforementioned substituent group E, into a borate according to, for example, one of the methods previously described concerning the compounds represented by the general formula (III-1), in the same way as in the preparation of the compounds having an anionic component represented by the general formula (I-2), E has the same meaning as in the general formula (I-2).

Specific examples of the compounds, which are represented by the general formula (III-1) or (III-2) and can be used in the present invention, are shown in Tables 7~9 by specifying the functional groups. However, it must be noted that the present invention is not limited to these examples.

TABLE 7

| Example | R¹ | R² | R³ | R⁴ | X⁺ |
|---|---|---|---|---|---|
| III-1a | mesityl | mesityl | phenyl | methyl | $N(CH_3)_4$ |
| III-1b | mesityl | mesityl | phenyl | butyl | $N(CH_3)_4$ |
| III-2a | bromomesityl | bromomesityl | phenyl | methyl | $N(CH_3)_4$ |
| III-3a | dichloromesityl | dichloromesityl | phenyl | methyl | $N(CH_3)_4$ |
| III-3b | dichloromesityl | dichloromesityl | phenyl | butyl | $N(CH_3)_4$ |
| III-4a | chloromesityl | chloromesityl | phenyl | methyl | $N(CH_3)_4$ |
| III-4b | chloromesityl | chloromesityl | phenyl | butyl | $N(CH_3)_4$ |
| III-5a | mesityl | mesityl | p-fluorophenyl | methyl | $N(CH_3)_4$ |
| III-5b | mesityl | mesityl | p-fluorophenyl | butyl | $N(CH_3)_4$ |
| III-6a | mesityl | mesityl | m-fluorophenyl | methyl | $N(CH_3)_4$ |
| III-6b | mesityl | mesityl | m-fluorophenyl | butyl | $N(CH_3)_4$ |
| III-7a | mesityl | mesityl | 3,4-difluorophenyl | methyl | $N(CH_3)_4$ |
| III-8a | mesityl | mesityl | 3,5-difluorophenyl | methyl | $N(CH_3)_4$ |
| III-9a | mesityl | mesityl | 3,5-bis(trifluoromethyl)phenyl | methyl | $N(CH_3)_4$ |
| III-9b | mesityl | mesityl | 3,5-bis(trifluoromethyl)phenyl | butyl | $N(CH_3)_4$ |
| III-10a | mesityl | mesityl | 3-bromo-5-fluorophenyl | methyl | $N(CH_3)_4$ |

TABLE 8

| Example | R¹ | R² | R³ | R⁴ | X⁺ |
|---|---|---|---|---|---|
| III-11a | mesityl | mesityl | p-chlorophenyl | methyl | $N(CH_3)_4$ |
| III-11b | mesityl | mesityl | p-chlorophenyl | butyl | $N(CH_3)_4$ |
| III-12a | mesityl | mesityl | m-chlorophenyl | methyl | $N(CH_3)_4$ |
| III-12b | mesityl | mesityl | m-chlorophenyl | butyl | $N(CH_3)_4$ |
| III-13a | mesityl | mesityl | p-bromophenyl | methyl | $N(CH_3)_4$ |
| III-14a | chloromesityl | chloromesityl | p-bromophenyl | methyl | $N(CH_3)_4$ |
| III-15a | mesityl | mesityl | 2,5-dimethyl-4-bromophenyl | methyl | $N(CH_3)_4$ |
| III-16a | mesityl | mesityl | mesityl | methyl | $N(CH_3)_4$ |
| III-17a | p-chloroduryl | p-chloroduryl | phenyl | butyl | $N(CH_3)_4$ |
| III-17b | p-chloroduryl | p-chloroduryl | butyl | methyl | $N(CH_3)_4$ |
| III-18a | o-tolyl | o-tolyl | o-tolyl | methyl | $N(CH_3)_4$ |
| III-18b | o-tolyl | o-tolyl | o-tolyl | butyl | $N(CH_3)_4$ |
| III-19a | o-methoxyphenyl | o-methoxyphenyl | o-methoxyphenyl | butyl | $N(CH_3)_4$ |
| III-20a | mesityl | mesityl | butyl | methyl | $N(CH_3)_4$ |
| III-21a | mesityl | mesityl | $(CH_3)_3$—$SiCH_2$ | methyl | $N(CH_3)_4$ |
| III-22a | mesityl | mesityl | phenyl | phenyl | $N(C_{10}H_{21})_4$ |
| III-22b | mesityl | mesityl | phenyl | phenyl | cyanine |
| III-23a | $(CH_3)_3$—Si—$CH_2$ | $(CH_3)_3$—Si—$CH_2$ | $(CH_3)_3$—$SiCH_2$ | $(CH_3)_3$—Si—$CH_2$ | $N(CH_3)_4$ |

TABLE 9

| Example | R¹ | R² | R³ | R⁴ | X⁺ |
|---|---|---|---|---|---|
| III-23b | $(CH_3)_3$—Si—$CH_2$ | $(CH_3)_3$—Si—$CH_2$ | $(CH_3)_3$—$SiCH_2$ | $(CH_3)_3$—Si—$CH_2$ | $N(C_4H_5)_4$ |
| III-23c | $(CH_3)_3$—Si—$CH_2$ | $(CH_3)_3$—Si—$CH_2$ | $(CH_3)_3$—$SiCH_2$ | $(CH_3)_3$—Si—$CH_2$ | Benzyltrimethyl-ammonium |
| III-23d | $(CH_3)_3$—Si—$CH_2$ | $(CH_3)_3$—Si—$CH_2$ | $(CH_3)_3$—$SiCH_2$ | $(CH_3)_3$—Si—ethyl- | Benzyltriammonium |
| III-23e* | $(CH_3)_3$—Si—$CH_2$ | $(CH_3)_3$—Si—$CH_2$ | $(CH_3)_3$—$SiCH_2$ | methyl | $N(CH_3)_4$ |
| III-24a | chloromesityl | chloromesityl | chloromesityl | methyl | $N(CH_3)_4$ |
| III-24b | chloromesityl | chloromesityl | chloromesityl | butyl | $N(CH_3)_4$ |
| III-25a | dichloromesityl | dichloromesityl | dichloromesityl | methyl | $N(CH_3)_4$ |

TABLE 9-continued

| Example | $R^1$ | $R^2$ | $R^3$ | $R^4$ | $X^+$ |
| --- | --- | --- | --- | --- | --- |
| III-26a | m-tolyl | m-tolyl | m-tolyl | methyl | $N(CH_3)_4$ |
| III-27a | p-tolyl | p-tolyl | p-tolyl | methyl | $N(CH_3)_4$ |
| III-28a | mesityl | mesityl | o-tolyl | methyl | $N(CH_3)_4$ |
| III-29a | mesityl | mesityl | p-dimethylaminophenyl | methyl | $N(CH_3)_4$ |
| III-32a | mesityl | mesityl | mesityl | methyl | $N(CH_3)_4$ |
| III-33a | dichloromesityl | dichloromesityl | 4'-bromobiphenyl | methyl | $N(CH_3)_4$ |
| III-34a*1 | mesityl | mesityl | 9-phenanthryl | butyl | $N(CH_3)_4$ |
| III-35a | mesityl | mesityl | 1-naphthyl | methyl | $N(CH_3)_4$ |
| III-35b | mesityl | mesityl | 1-naphthyl | butyl | $N(CH_3)_4$ |

*The compound of Example 23e is a mixture comprising the compound of Example 23a, tetramethylammonium methyl-tris (trimethylsilylmethyl) borate, and tetramethylammonium dimethyl-bis (trimethylsilylmethyl) borate at a ratio of 3:10:1.

Next, other borate compounds, i.e., the borate compounds represented by the general formula (IV), for use in the photosensitive composition of the present invention are explained below.

The borate compound represented by the general formula (IV) can be obtained by, for example, reacting a triorganylborane (A) with an organometallic reagent, e.g., an alkyllithium compound or a Grignard reagent, as in the preparation of the borate compounds represented by the general formula (II).

When these organometallic reagents are used, conditions for the reaction are the same as those for the preparation of the compounds represented by the general formula (III-1) or (III-2). Further, preferred examples of the counter cation G of the compound represented by the general formula (IV) are the same as those described with respect to the compounds represented by the general formula (III-1) or (III-2).

Specific examples of the borate compounds, which are represented by the general formula (IV) and can be used in the present invention, are shown in Tables 10~12 by specifying the functional groups. However, it must be noted that the present invention is not limited to these examples.

TABLE 10

| Example | $R^2$ | $R^1, R^3, R^4$ (same) | $X^+$ |
| --- | --- | --- | --- |
| IV-1 | butyl | 2,6-difluorophenyl | $N(CH_3)_4$ |
| IV-2 | hexyl | 4-chlorophenyl | $N(CH_3)_4$ |
| IV-3 | hexyl | 3-trifluoromethyl | $NH_4$ |
| IV-4 | butyl | 3-fluorophenyl | $N(CH_3)_4$ |
| IV-5 | hexyl | 3-fluorophenyl | $N(CH_3)_4$ |
| IV-5a | ethyl | 3-fluorophenyl | $N(CH_3)_4$ |
| IV-5b | ethyl | 3-fluorophenyl | $N(C_4H_5)_4$ |
| IV-6 | hexyl | 3-fluorophenyl | QTX*1 |
| IV-7 | hexyl | 3-fluorophenyl | cyanine*2 |
| IV-8 | hexyl | 3,5-difluorophenyl | $N(CH_3)_4$ |
| IV-9 | methyl | 2-(trifluoromethyl)phenyl | $N(CH_3)_4$ |
| IV-10 | butyl | 2-(trifluoromethyl)phenyl | $N(CH_3)_4$ |
| IV-11 | butyl | (4-methylphenyl-oxazoline) | $N(CH_3)_4$ |
| IV-12 | methyl | 4-bromophenyl | $N(CH_3)_4$ |
| IV-13 | hexyl | 3-chlorophenyl | $N(CH_3)_4$ |
| IV-14 | hexyl | 4-bromophenyl | $N(CH_3)_4$ |

TABLE 10-continued

| Example | $R^2$ | $R^1, R^3, R^4$ (same) | $X^+$ |
| --- | --- | --- | --- |
| IV-15 | butyl | (3-methylphenyl-oxazoline) | $N(CH_3)_4$ |
| IV-16 | benzyl | m-fluorophenyl | $N(CH_3)_4$ |
| IV-17 | hexyl | m-fluorophenyl | $N(CH_4H_3)_4$ |
| IV-18 | hexyl | m-fluorophenyl | $N(C_{10}H_{21})_4$ |
| IV-19 | hexyl | m-fluorophenyl | iodonium*3 |

*1: thioxanthone-derived QTX structure with $-O-CH_2CH(OH)-CH_2-N^{\oplus}(CH_3)_3$ substituent

*2: cyanine dye structure with two indolinium rings connected by $-CH=CH-CH=$ bridge, N-$C_4H_9$ groups

*3: diphenyliodonium structure $Ph-I^{\oplus}-C_6H_4-OC_8H_{17}$

TABLE 11

| Example | $R^2$ | $R^1, R^3, R^4$ (same) | $X^+$ |
| --- | --- | --- | --- |
| IV-20 | hexyl | m-fluorophenyl | pyrylium*4 |
| IV-21 | hexyl | m-fluorophenyl | methylene blue cation |
| IV-22 | hexyl | m-fluorophenyl | safranine-o-cation |
| IV-23 | hexyl | m-phenoxyphenyl | $N(CH_3)_4$ |
| IV-24 | hexyl | p-(diisopropylaminosulfonyl)phenyl | $N(CH_3)_4$ |

TABLE 11-continued

| Example | R² | R¹, R³, R⁴ (same) | X⁺ |
|---|---|---|---|
| IV-25 | hexyl | p-(2,6-di-tert-butyl-4-methylphenoxycarbonyl)phenyl | N(CH₃)₄ |
| IV-26 | hexyl | p-(diisopropylaminocarbonyl)phenyl | N(CH₃)₄ |
| IV-27 | methyl | dichloromesityl | N(CH₃)₄ |

*4
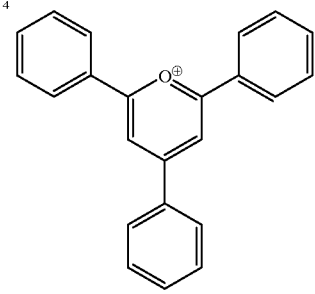

TABLE 12

| Example | R¹ | R² | R³ | R⁴ | X⁺ |
|---|---|---|---|---|---|
| IV-28 | butyl | p-bromophenyl | mesityl | mesityl | N(CH₃)₄ |
| IV-29 | butyl | p-fluorophenyl | mesityl | mesityl | N(CH₃)₄ |
| IV-30 | p-methylbenzyl | p-chlorophenyl | mesityl | mesityl | N(CH₃)₄ |
| IV-31 | hexyl | phenyl | o-methylphenyl | p-chlorophenyl | N(CH₃)₄ |
| IV-32 | allyl | m-fluorophenyl | m-fluorophenyl | m-fluorophenyl | N(CH₃)₄ |
| IV-33 | p-methylbenzyl | m-fluorophenyl | m-fluorophenyl | m-fluorophenyl | N(CH₃)₄ |
| IV-34 | α-methylbenzyl | m-fluorophenyl | m-fluorophenyl | m-fluorophenyl | N(CH₃)₄ |

These borate compounds are described in, for example, JP-A Nos. 9-188,685 and 9-188,686.

When a photosensitive layer is made from the photosensitive composition of the present invention, the contained amount of the borate compound as solids in the photosensitive layer is in the range of from 0.01 to 3 g/m², and more preferably in the range of from 0.02 to 1.0 g/m². A contained amount outside this range is not desirable, because the effect of the present invention is not sufficient if the contained amount is less than 0.01 g/m², and the effect is not increased even if the contained amount is more than 3 g/m². From the standpoint of effect, the borate compound and the photopolymerization initiator are contained preferably in the same layer in the photosensitive layer.

A preferred example of the photopolymerization initiator in the present invention is a cationic dye/borate complex compound comprising an anionic component represented by the general formula (I-1), (I-2), or (II) and a cationic dye having a structure such as the structure of a spectrally sensitizing dye. The cationic dye includes a dye, such as cyanine dye, and a dye in which a cation portion, such as a quaternary ammonium ion, forms a covalent bond with another neutral dye structure through a bridging group.

A cationic dye/borate anion complex is known in the art. The preparation of the complex and the use of the complex in an imaging system are described in, e.g., U.S. Pat. Nos. 3,567,453, 4,307,182, 4,343,891, 4,447,521, and 4,450,227.

The borate anion is designed in order that the borate radical, which is generated when exposure of the borate anion to light causes transfer of electrons to the dye, is easily dissociated to thereby form a radical as indicated below:

$BR_4 \cdot \rightarrow BR_3 + R \cdot$

For example, particularly preferred are triphenylbutylborate anion and trianisylbutylborate anion, because these anions are easily dissociated to generate triphenylborane and trianisylborane, respectively, and a butyl radical. On the other hand, a tetrabutylborate anion does not satisfactorily function for the purpose, presumably because the tetrabutylborate radical is not stable and presumably because it to the contrary accepts electrons from the dye and is not efficiently dissociated. Also unsatisfactory in terms of function is a tetraphenylborate anion, because a phenyl radical is not easily formed.

Generally, the effectiveness of a useful cationic dye/borate anion complex needs to be confirmed experimentally. However, the effectiveness of a possible combination of a cationic dye and a borate anion can be identified by the use of Weller's equation (Rehm, D. and Weller, A., Isr. J. Chem. (1970), 8, 259–271), and the equation can be simplified as follows:

$\Delta G = E_{ox} - E_{red} - E_{hv}$ where $\Delta G$ is the change in Gibbs free energy; $E_{ox}$ is the oxidation potential of the borate anion BR4⁻; $E_{red}$ is the reduction potential of the cationic dye; and $E_{hv}$ is the energy of light used for excitation of the dye.

Presumably, a useful complex exhibits a negative free energy change. Likewise, the difference between the reduction potential of the dye and the oxidation potential of the borate anion needs to be a negative value for a complex to be stable in a dark place. That is:

$E_{ox} - E_{red} > 0$

As stated above, the equation is a simplified one, and does not absolutely predict whether a complex is effective or not in the present invention. Many other factors influence the decision. One of these factors is the effect of a monomer on the complex. It is known that a deviation from the Weller's equation can take place if the equation gives an excessively large negative value. Further, the Weller's equation merely predicts the movement of electrons and does not predict-whether or not a specific dye complex is an efficient polymerization initiator. This equation provides a useful primary approximation.

Examples of the cationic dye/borate anion complex useful in the present invention include a cationic dye/borate complex compound having an anionic component represented by the general formula (I-1), (I-2), or (II). Some preferred specific examples of the compounds are given below. However, it must be noted that the present invention is not limited to these examples.

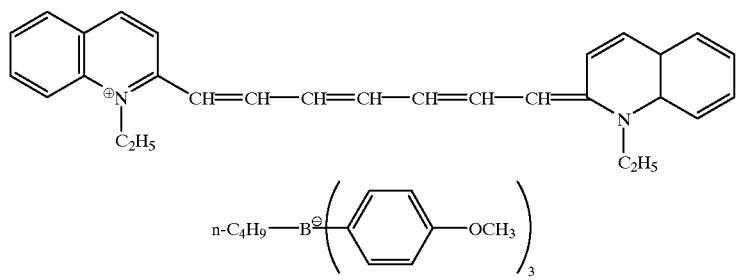

(1)

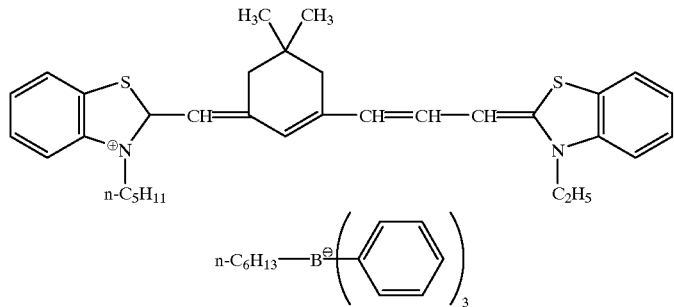

(2)

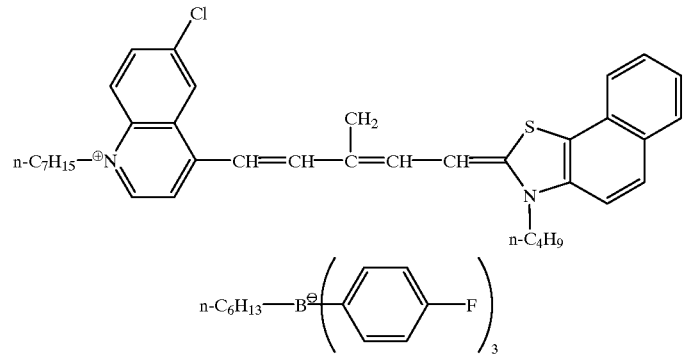

(3)

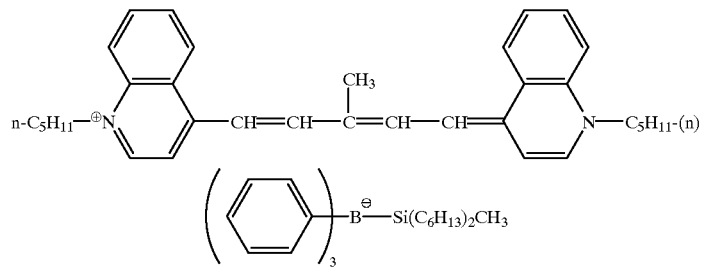

(4)

-continued
(5)
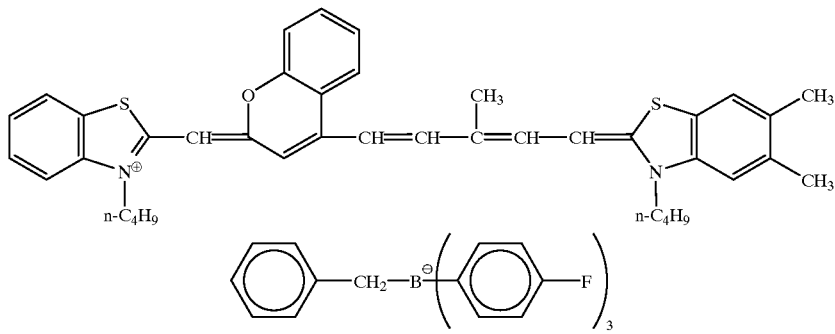
(6)
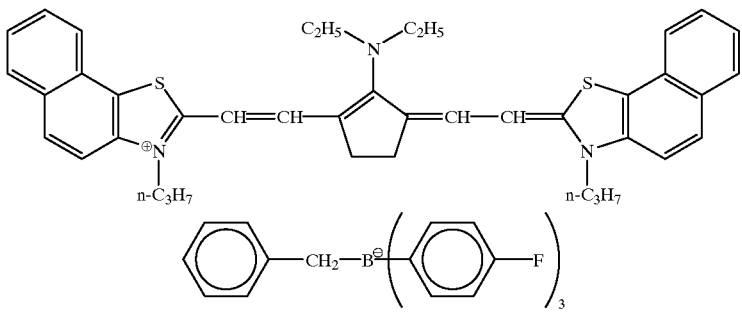
(7)
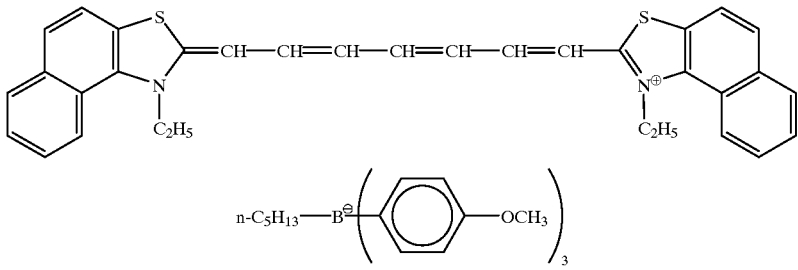
(8) (9)
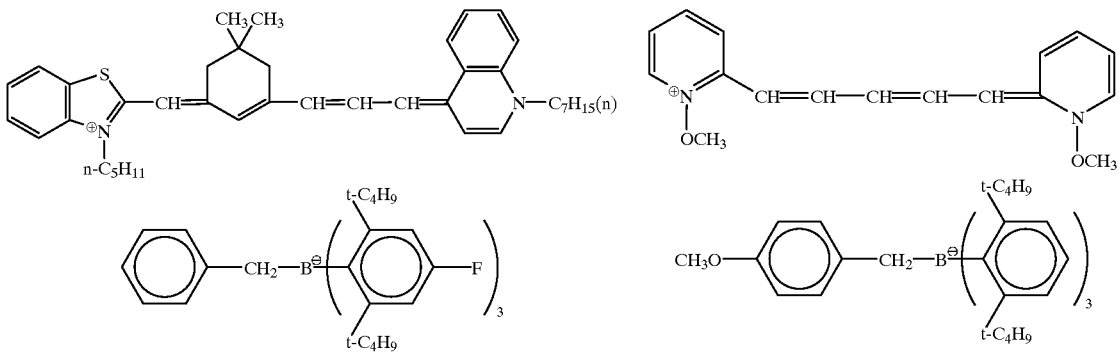
(10)
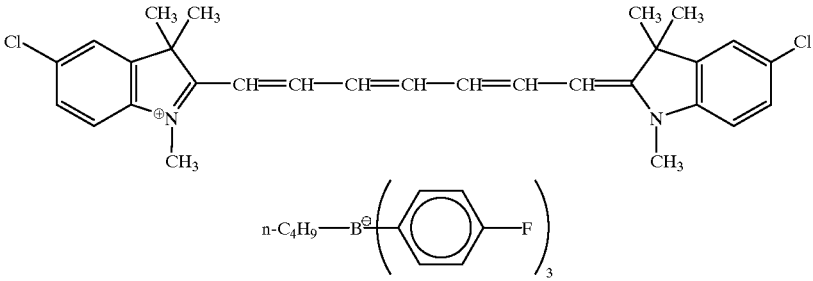

-continued
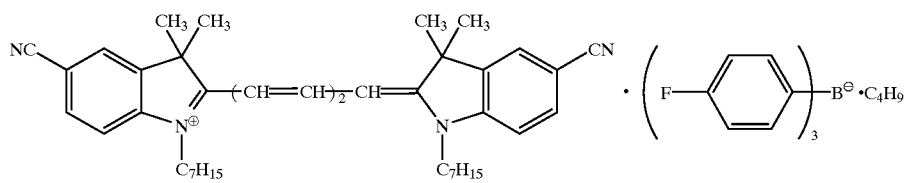
(11)
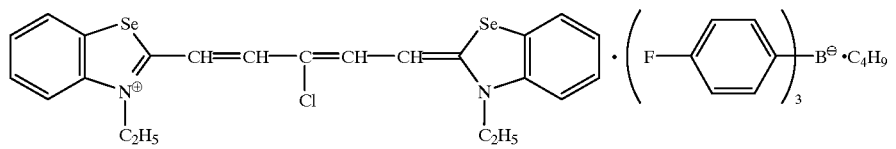
(12)
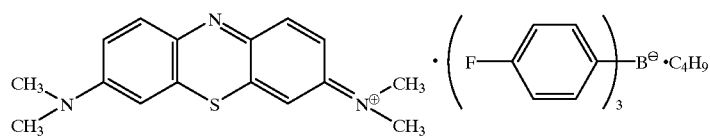
(13)
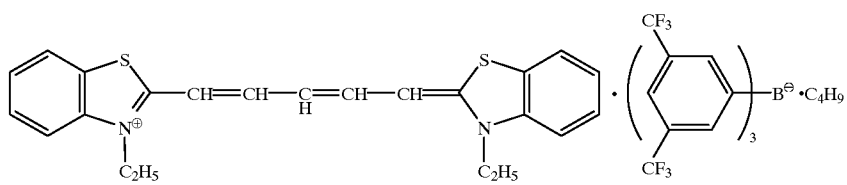
(14)
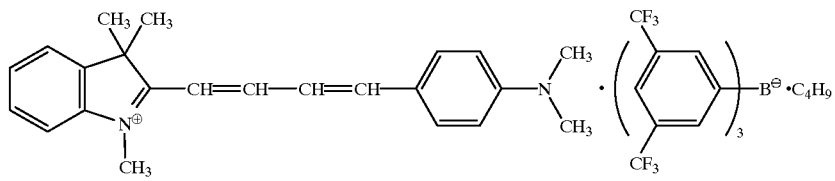
(15)
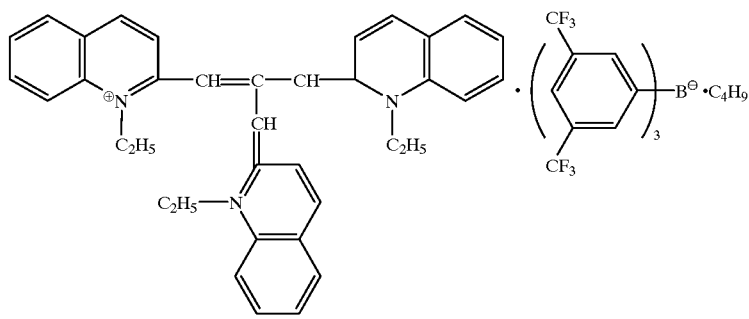
(16)
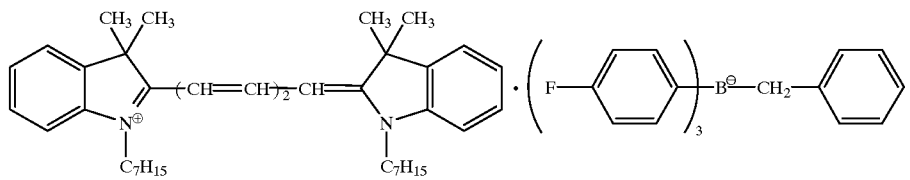
(17)
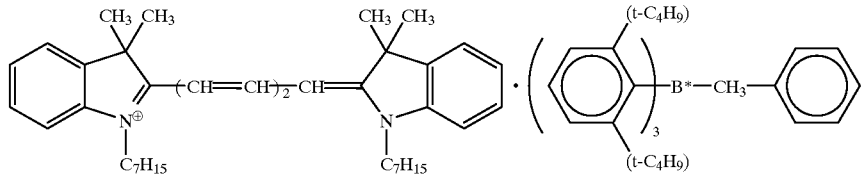
(18)

-continued
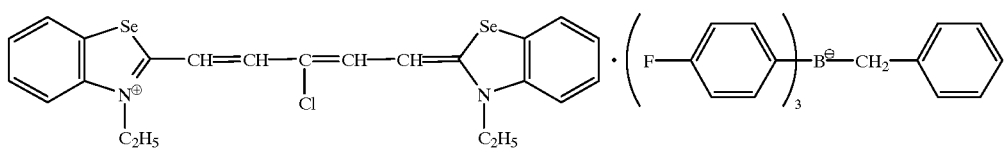 (19)
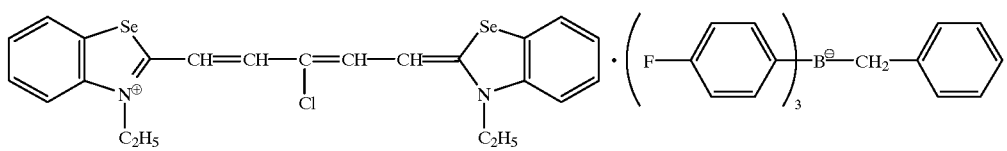 (20)
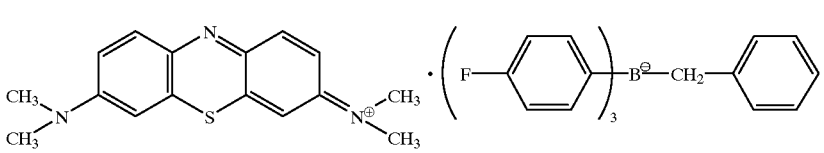 (21)
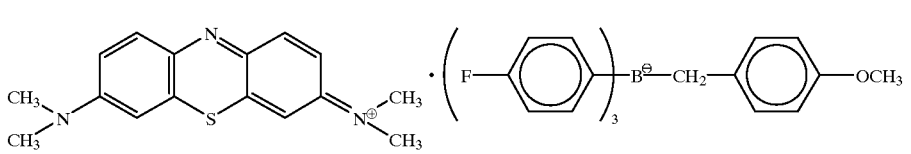 (22)
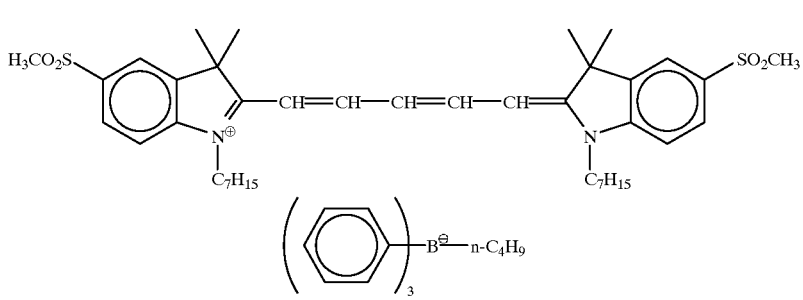 (23)
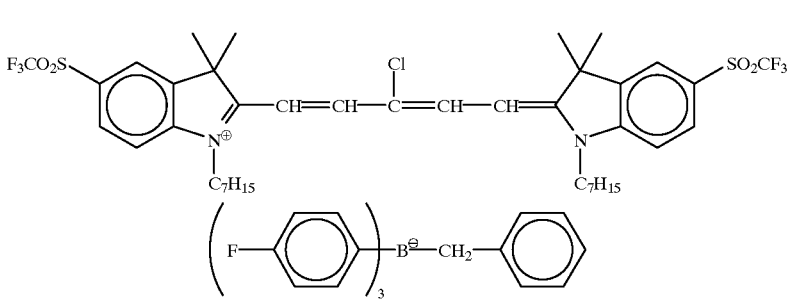 (24)
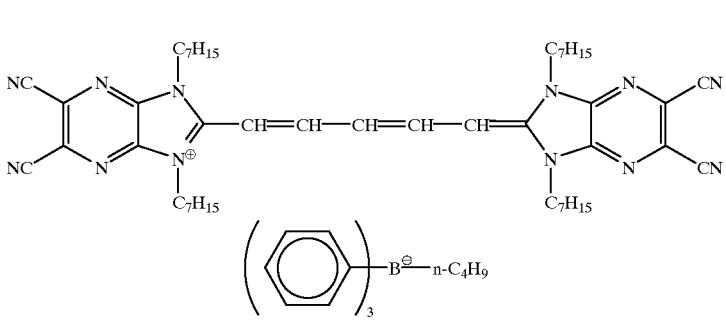 (25)

The cationic dye/borate anion complex can be prepared by a known, counter-ion exchanging reaction between a borate salt and a dye. Details of the reaction are disclosed in Hishiki, y., Repts. Sci-Research Inst. (1953), 29, pp.72–79. Examples of useful borate salts are sodium salts, such as sodium tetraphenylborate, sodium triphenylbutylborate, sodium trianisylbutylborate, and the like, and ammonium salts such as tetraethylammonium tetraphenylborate.

As for photodecomposable aromatic diazo compounds, known compounds can be used in the present invention. Examples of the compounds include: photodecomposable aromatic diazo compounds, such as diazonium salts, diazo sulfonates, iminoquinone diazides, and naphthoquinone diazides, described in chapters 6 and 7 of J. Koser, "Light Sensitive Systems", John Wiley & Sons Inc. Although all of these aromatic diazo compounds can be used, preferable are nonionic aromatic diazo compounds, such as iminoquinone diazides and naphthoquinone diazides because of better stability of the borate anion. From this standpoint, a diazo compound having as the anion portion thereof a weak acidic group such as an organic carboxylic group is more desirable than a diazo compound having a strong basic group such as $RF_6^-$.

The sensitization method by use of the photosensitive composition of the present invention can be applied to a diazo-process photography if the photosensitive composition is added to the photosensitive layer of any known photosensitive material for diazo-process photography.

The amount added of the photosensitive composition is preferably in the range of from 1 to 50% by weight based on the weight of the solids of the photosensitive layer, although the amount is not particularly specified.

The diazonium salt compound comprising a specific borate anionic component of the present invention is added to a known photopolymerizable, photosensitive composition as described in JP-A No. 62-143,044, if the photosensitive composition of the present invention is used in a photopolymerization system. The amount added is preferably in the range of from 0.01 to 10% by weight based on the weight of the photosensitive composition, although the amount is not particularly specified.

The polymerizable monomers, which can be used for the preparation of the photopolymerizable, photosensitive composition, are not particularly limited, provided these monomers are unsaturated compounds capable of radical polymerization. For example, these monomers are polyol esters of unsaturated acids, particularly acrylic acid and methacrylic acid. Specific examples include ethylene glycol diacrylate, glycerin triacrylate, polyacrylateg ethylene glycol dimethacrylate, 1,3-propanediol dimethacrylate, polyethylene glycol dimethacrylate, 1,2,4-butanetriol trimethacrylate, trimethylolethane triacrylate, pentaerythritol dimethacrylate, pentaerythritol trimethacrylate, pentaerythritol tetramethacrylate, pentaerythritol diacrylate, pentaerythritol triacrylate, pentaerythritol tetraacrylate, pentaerythritol polyacrylate, 1,3-propanediol diacrylate, 1,5-pentanediol dimethacrylate, bisacrylate and bismethacrylate of polyethylene glycol having a molecular weight in the range of from 200 to 400, and the like.

An unsaturated amide can be used as the unsaturated compound. Examples of the unsaturated amide include unsaturated amides made from acrylic acid or methacrylic acid and containing an $\alpha$, $\omega$-diamine, and ethylene-bismethacrylamide. The alkylene chain of the unsaturated amide may have carbon-atom spacing. However, it must be noted that the photopolymerizable monomers are not limited to these compounds.

According to need, an organic, polymeric binder may be used in the present invention. In particular, the organic, polymeric binder is preferably a vinyl-based polymeric material from the standpoint of compatibility of the binder with the above-mentioned monomer and the diazo compound having the aforementioned borate anion component. Some illustrative nonlimiting examples of the vinyl-based polymeric material include polystyrene, polyvinyl chloride, polyacrylic acid, polymethyl acrylate, polyethyl acrylate, polybutyl acrylate, polymethacrylic acid, polymethyl methacrylate, polybenzyl methacrylate, polyvinyl ether, polyvinyl acetal, polyacrylonitrile, poly-2-ethylhexyl acrylate, poly-2-ethylhexyl methacrylate, polymaleic acid, and copolymers thereof.

Generally, the blending ratio of the monomer to the organic, polymeric binder is preferably in the range of from 1:10 to 2:1(by weight), although the ratio varies depending on the combination of the monomer and the organic, polymeric binder to be used. Meanwhile, the amount added of the specific diazo compound of the present invention is preferably in the range of from 0.01 to 20% by weight, of the amount of the polymerizable monomer to be used.

The present invention is further explained below by way of examples. Therefore, the following examples are to be considered as illustrative and are not restrictive.

EXAMPLES

Example 1

A photosensitive liquid was prepared according to the following formulation, and the photosensitive liquid was coated on a 100 $\mu$m thick polyethylene terephthalate film so that a dry layer having a thickness of 2 $\mu$m was obtained.

| Photosensitive liquid | in grams |
| --- | --- |
| a benzyl methacrylate/methacrylic acid copolymer (molar ratio: 67/33; $\{\eta\}$ = 0.13 in MEK at 23° C.) | 1.3 g |
| pentaerythritol tetraacrylate | 1.4 |
| methyl ethyl ketone | 12 |
| methyl cellosolve acetate | 7.5 |
| a spectrally sensitizing dye (23) having the structure given below | 0.083 |
| a diazonium salt compound | 0.087 |

(a 1:1 complex compound comprising a diazonium salt cation portion (previously illustrated by cation portion (3)-2) and borate anion portion (illustrated by I-35a) represented by the general formula (I-1) or (I-2) and shown in Table 3)

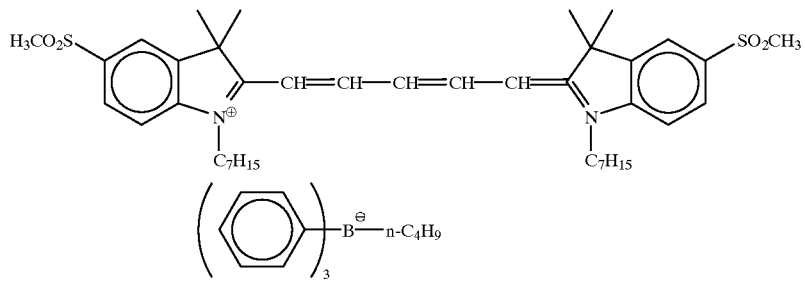

Spectrally sensitizing dye (23)

Next, a liquid according to the following formulation to form a protective layer was coated on the above-mentioned sample so that a dry layer having a thickness of 1.5 μm was obtained.

| polyvinyl alcohol PVA-205 | 40 g |
|---|---|
| water | 1 liter |

The sample thus obtained was exposed to a semiconductor laser having a wavelength of 657 nm and then developed by using a liquid prepared by 5-fold dilution of the developer CA-1 manufactured by Fuji Film Co., Ltd. for preparing printing plates. The sensitivity was 0.5 mJ/cm$^2$.

Example 2

A photosensitive material was prepared by repeating the procedure of Example 1, except that a complex compound, which was obtained by replacing, in the photosensitive liquid of Example 1, the borate anion portion (I-35a) of diazonium salt compound with the borate anion portion (I-6a) shown in Table 1, was used. The photosensitive material thus prepared was evaluated in the same way as in Example 1. The sensitivity was 0.65 mJ/cm$^2$.

Example 3

A photosensitive material wax prepared by repeating the procedure of Example 1, except that a complex compound, which was obtained by replacing, in the photosensitive liquid of Example 1, the borate anion portion (I-35a) of the diazonium salt compound with the borate anion portion (II-5), represented by the general formula (II) and shown in Table 4, was used. The photosensitive material thus prepared was evaluated in the same way as in Example 1. The sensitivity was 0.85 mJ/cm$^2$.

Example 4

A photosensitive material was prepared by repeating the procedure of Example 1, except that a complex compound, which was obtained by replacing, in the photosensitive liquid of Example 1, the borate anion portion (I-35a) of the diazonium salt compound with the borate anion portion (II-16), represented by the general formula (II) and shown in Table 4, was used. The photosensitive material thus prepared was evaluated in the same way as in Example 1. The sensitivity was 0.55 mJ/cm$^2$.

Example 5

A photosensitive material was prepared by repeating the procedure of Example 1, except that a complex compound, which was obtained by replacing, in the photosensitive liquid of Example 1, the diazonium cation portion (illustrated by cation portion (3)-2) of the diazonium salt compound with the diazonium cation portion (illustrated by cation portion (3)-3), was used. The photosensitive material thus prepared was evaluated in the same way as in Example 1. The sensitivity was 0.55 mJ/cm$^2$.

Example 6

A photosensitive material was prepared by repeating the procedure of Example 1, except that a complex compound, which was obtained by replacing, in the photosensitive liquid of Example 1, the diazonium cation portion (illustrated by cation portion (3)-2) of the diazonium salt compound with the diazonium cation portion (illustrated by cation portion (4)-1), was used. The photosensitive material thus prepared was evaluated in the same way as in Example 1. The sensitivity was 0.68 mJ/cm$^2$.

Example 7

A photosensitive material was prepared by repeating the procedure of Example 1, except that 0.05 g of the diazonium salt compound (illustrated by compound (3')-2) and 0.05 g of the borate compound (III-35a), represented by the general formula (III-1) or (III-2) and shown in Table 8, were used in place of the complex compound, i.e., the diazonium salt compound, in the photosensitive liquid of Example 1. The photosensitive material thus prepared was exposed to UV light having a wavelength of 370 nm and then developed by using a liquid prepared by 5-fold dilution of the developer CA-1 manufactured by Fuji Film Co., Ltd. for preparing printing plates. The sensitivity was 2.1 mJ/cm$^2$.

Example 8

A photosensitive material was prepared by repeating the procedure of Example 7, except that a borate compound (IV-5) represented by the general formula (IV) and shown in Table 10, wherein the hexyl group of R$^2$ was changed to a benzyl group, was used in place of the borate compound (III-35a) in the photosensitive liquid of Example 7. The photosensitive material thus prepared was evaluated in the same way as in Example 7. The sensitivity was 1.5 mJ/cm$^2$.

Comparative Example 1

A photosensitive material was prepared by repeating the procedure of Example 1, except that 0.09 g of the diazonium salt compound (illustrated by compound (3')-2) alone was used in place of the complex compound, i.e., the diazonium salt compound, in the photosensitive liquid of Example 1. The photosensitive material thus prepared was evaluated in the same way as in Example 1. The sensitivity was 1.5 mJ/cm$^2$.

Comparative Example 2

A photosensitive material was prepared by repeating the procedure of Example 1, except that 0.05 g of the borate compound (IV-5) represented by the general formula (IV) and shown in Table 10, wherein the hexyl group of $R^2$ was changed to a benzyl group, alone was used in place of the complex compound, i.e., the diazonium salt compound, in the photosensitive liquid of Example 1. The photosensitive material thus prepared was evaluated in the same way as in Example 1. The sensitivity was 3 mJ/cm².

Next, the photosensitive materials of Examples 1~8 and Comparative Examples 1 and 2 were each stored at a high temperature of 30% RH at 50° C. or in a highly humid condition of 80% RH at 35° C. for 1 day. After storage, the materials were evaluated in the same way as above. The results are shown in Table 13.

TABLE 13

|  | sensitivity of fresh samples (mJ/cm²) | sensitivity of samples after storage (mJ/cm²) | |
|---|---|---|---|
|  |  | 30% RH at 50° C. for 1 day | 80% RH at 35° C. for 1 day |
| Example 1 | 0.5 | 0.53 | 0.5 |
| Example 2 | 0.65 | 0.66 | 0.65 |
| Example 3 | 0.85 | 0.9 | 0.85 |
| Example 4 | 0.55 | 0.56 | 0.56 |
| Example 5 | 0.55 | 0.57 | 0.55 |
| Example 6 | 0.68 | 0.7 | 0.69 |
| Example 7 | 2.1 | 2.2 | 2.15 |
| Example 8 | 1.5 | 1.6 | 1.55 |
| Comparative example 1 | 1.5 | 5.0 | 3.0 |
| comparative example 2 | 3.0 | 10 | 5.0 |

As can be seen from the results of Table 13, it was found that the photosensitive compositions of Examples 1~8 of the present invention had d high sensitivity. It was also found that the photosensitive materials obtained from these photosensitive compositions were superior in stability over time because the photosensitive materials exhibited almost no decrease in sensitivity even after having been stored under conditions of high temperatures or high humidity. Further, Examples 7 and 8 made it clear that the photosensitive compositions of the present invention were sensitive not only to rays in the visible region but also to rays in the UV region. In contrast, the photosensitive compositions of Comparative Examples 1 and 2 had a lower sensitivity and inferior stability in storage in comparison with the compositions of Examples 1~6.

The Compositions of the present invention have the following advantages: the compositions can be applied to diazo-process photography and also to photopolymerization; the compositions have a high sensitivity; stability over time of the compositions is excellent.

What is claimed is:

1. A photosensitive composition comprising a polymerizable monomer, a photopolymerization initiator, and a diazonium salt compound containing an anion portion represented by the general formula (I-1), (I-2), or (II) given below:

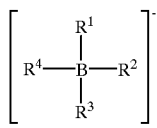

General formula (I-1)

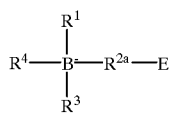

General formula (I-2)

wherein, in the general formulas (I-1) and (I-2), $R^1$ and $R^2$ each independently represent a phenyl group, an aromatic hydrocarbyl group that may contain a heteroatom and is a group other than the phenyl group, an alkyl group that has 1 to 20 carbon atoms and is substituted by $—Si(R^9)(R^{10})(R^{11})$, or a group represented by the formulae (ii), (iia), or (iib) given below, and the phenyl group and the aromatic hydrocarbyl group may each be substituted by a group selected from the group consisting of an alkyl group having 1 to 20 carbon atoms, an alkyl group having 2 to 20 carbon atoms and containing O, $S(O)_p$ or $NR^5$, $OR^6$, $R^6S(O)_p$, $R^6SO_3$, $N(R^7)(R^8)$, $R^6OCO$, $CON(R^7)(R^8)$, $COR^9$, $Si(R^9)(R^{10})(R^{11})$, $Sn(R^9)(R^{10})(R^{11})$ $B(R^{12})(R^{13})$, a halogen atom, $(R^9)(R^{10})P(O)_q$, and CN, so that at least one ortho position of the phenyl group and the aromatic hydrocarbyl group is substituted by a substituent group; and $R^{2a}$ represents a phenylene group or another divalent aromatic hydrocarbyl group that may contain a heteroatom, wherein the aromatic hydrocarbyl group may be substituted by a group selected from the group consisting of an alkyl group having 1 to 20 carbon atoms, an alkyl group having 2 to 20 carbon atoms and containing O, $S(O)_p$ or $NR^5$, $OR^6$, $R^6S(O)_p$, $R^6SO_3$, $N(R^7)(R^8)$, $R^6OCO$, $CON(R^7)(R^8)$, $COR^9$, $Si(R^9)(R^{10})(R^{11})$, $Sn(R^9)(R^{10})(R^{11})$, $B(R^{12})(R^{13})$, a halogen atom, $(R^9)(R^{10})P(O)_q$, CN, and a group represented by the formula (a) given below:

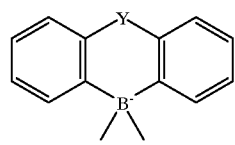

(ii)

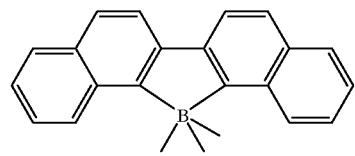

(iia)

-continued

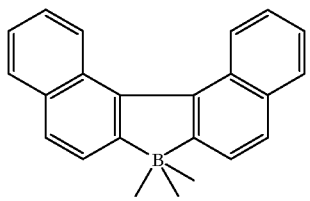
(iib)

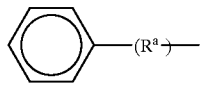
(a)

wherein, in the formula (a), $R^a$ represents an alkylene group, an alkyl group having 1 to 12 carbon atoms, an alkoxy group having 1 to 12 carbon atoms, or a substituted alkylene group bearing a substituent selected from the group consisting of $R^6OCO$, CN, and a halogen atom; and in the formulae (ii), (iia), and (iib), the aromatic ring may be substituted by a group selected from the group consisting of an alkyl group having 1 to 20 carbon atoms, an alkyl group having 2 to 20 carbon atoms and containing O, $S(O)_p$ or $NR^5$, $OR^6$, $R^6S(O)_p$, $R^6SO_3$, $N(R^7)(R^8)$, $R^6OCO$, $CON(R^7)(R^8)$, $COR^9$, $Si(R^9)(R^{10})(R^{11})$, $Sn(R^9)(R^{10})(R^{11})$, $B(R^{12})(R^{13})$, a halogen atom, $(R^9)(R^{10})P(O)_q$, and CN; and Y represents $(CH_2)_n$, CH=CH, CO, $NR^5$, O, $S(O)_p$, or a group represented by the formula given below:

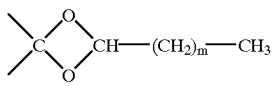

wherein, $R^3$ represents an alkyl group that has 1 to 20 carbon atoms and is substituted by $—Si(R^9)(R^{10})(R^{11})$, a phenyl group, or an aromatic hydrocarbyl group that is other than the phenyl group and may contain a heteroatom, and the phenyl group and the aromatic hydrocarbyl group may be substituted by a group selected from the group consisting of an alkyl group having 1 to 20 carbon atoms, an alkyl group having 2 to 20 carbon atoms and containing O, $S(O)_p$ or $NR^5$, $OR^6$, $R^6S(O)_p$, $R^6SO_3$, $N(R^7)(R^8)$, $R^6OCO$, $CON(R^7)(R^8)$, $COR^9$, $Si(R^9)(R^{10})(R^{11})$, $Sn(R^9)(R^{10})(R^{11})$, $B(R^{12})(R^{13})$, a halogen atom, $(R^9)(R^{10})P(O)_q$, and CN; and $R^4$ represents a group selected from the group consisting of a phenyl group, an aromatic hydrocarbyl group that is other than the phenyl group and may contain a heteroatom, an alkyl group having 1 to 20 carbon atoms, an alkyl group having 2 to 20 carbon atoms and containing O, $S(O)_p$ or $NR^5$, a cycloalkyl group having 3 to 12 carbon atoms, an alkenyl group having 2 to 8 carbon atoms, and a group represented by the formula (a) or (b) given below:

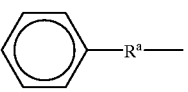
(a)

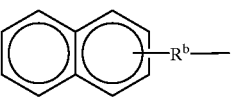
(b)

wherein, in the formulas (a) and (b), $R^a$ and $R^b$ each independently represent an alkylene group or a as substituted alkylene group bearing a substituent selected from the group consisting of an alkyl group having 1 to 12 carbon atoms, an alkoxy group having 1 to 12 carbon atoms, $R^6OCO$, CN, and a halogen atom;

the substituent group represented by $R^4$ may be substituted by a group selected from the group consisting of $OR^6$, $R^6S(O)_p$, $R^6SO_3$, $N(R^7)(R^8)$, $R^6OCO$, $CON(R^7)(R^8)$, $COR^9$, $Si(R^9)(R^{10})(R^{11})$, $Sn(R^9)(R^{10})(R^{11})$, $B(R^{12})(R^{13})$, a halogen atom, $(R^9)(R^{10})P(O)_q$, and CN;

n is an integer of 0, 1, or 2; m is an integer of 2 or 3; p is an integer of 0, 1, or 2; and q is an integer of 0 or 1;

$R^5$ represents a hydrogen atom, an alkyl group having 1 to 12 carbon atoms, a phenyl group, or a group represented by the formula (a), wherein the phenyl group and the group represented by the formula (a) may be substituted by a group selected from the group consisting of an alkyl group having 1 to 6 carbon atoms, an alkoxy group having 1 to 12 carbon atoms, $R^6OCO$, CN, and a halogen atom; wherein $R^6$ represents an alkyl group having 1 to 12 carbon atoms and a phenyl group, each of which may be substituted by a halogen atom;

$R^7$ and $R^8$ each represent an alkyl group having 1 to 12 carbon atoms, a cycloalkyl group having 3 to 12 carbon atoms, a phenyl group, or a group represented by the formula (a), wherein the phenyl group and the group represented by the formula (a) may be substituted by a group selected from the group consisting of an alkyl group having 1 to 6 carbon atoms, an alkoxy group having 1 to 12 carbon atoms, $R^6OCO$, CN, and a halogen atom; and $R^7$ and $R^8$ may form together with a nitrogen atom to which $R^7$ and $R^8$ are linked a 5-membered or 6-membered ring, which may contain O or S;

$R^9$, $R^{10}$ and $R^{11}$ each independently represent an alkyl group having 1 to 12 carbon atoms, a cycloalkyl group having 3 to 12 carbon atoms, a phenyl group, or a group represented by the formula (a), wherein the phenyl group and the group represented by the formula (a) may be substituted by a group selected from the group consisting of an alkyl group having 1 to 6 carbon atoms, an alkoxy group having 1 to 12 carbon atoms, $R^6OCO$, CN, and a halogen atom;

$R^{12}$ and $R^{13}$ each represent the same groups as those defined for $R^9$–$R^{11}$, provided $R^{12}$ and $R^{13}$ may form together with the boron atom to which $R^{12}$ and $R^{13}$ are linked a 5-membered or a 6-membered ring, which may contain O or S;

R$^{14}$, R$^{15}$ and R$^{16}$ each independently represent a group selected from the group consisting of an alkyl group having 1 to 12 carbon atoms, an alkenyl group having 2 to 12 carbon atoms, a cycloalkyl group having 3 to 12 carbon atoms, a phenyl group, and a group represented by the formula (a), wherein the alkyl group, the alkenyl group, and the cycloalkyl group may be substituted by R$^6$OCO or CN; and the phenyl group and the group represented by the formula (a) maybe substituted by a group selected from the group consisting of an alkyl group having 1 to 6 carbon atoms, an alkoxy group having 1 to 12 carbon atoms, R$^6$OCO, CN, and a halogen atom; and E represents P(R$^{14}$)(R$^{15}$), S(R$^6$), or N(R$^7$)(R$^8$), wherein R$^6$~R$^{15}$ are as previously defined; and General formula (II)

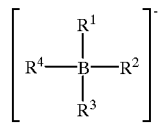

wherein, in the general formula (II), R$^1$ represents an alkyl group having 1 to 20 carbon atoms, a cycloalkyl group having 3 to 12 carbon atoms, an alkenyl group having 2 to 8 carbon atoms, or a group represented by the formula (a) or (b) given below, and the substituent group represented by R$^1$ may contain in the structure thereof O, S(O)$_p$, or NR$^5$ as a bridging group;

(a)

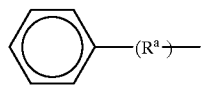

(b)

wherein, in the formulas (a) and (b), R$^a$ and R$^b$ each independently represent an alkylene group or a substituted alkylene group bearing a substituent selected from the group consisting of an alkyl group having 1 to 12 carbon atoms, an alkoxy group having 1 to 12 carbon atoms, R$^6$OCO, CN, and a halogen atom, wherein R$^6$ is as previously defined;

the substituent group represented by R$^1$ may be further substituted by a group selected from the group consisting of an alkyl group having 1 to 20 carbon atoms, OR$^6$, R$^7$S(O)$_p$, R$^7$SO$_3$, N(R$^8$)(R$^9$), Si(R$^{10}$)(R$^{11}$)(R$^{12}$), B(R$^{13}$)(R$^{14}$), a halogen atom, and (R$^{15}$)(R$^{16}$)P(O)$_q$; and R$^2$~R$^4$ each independently represent a phenyl group or a biphenyl group; wherein the substituent groups represented by R$^2$~R$^4$ may be further substituted by a group selected from the group consisting of an alkyl group having 1 to 20 carbon atoms (this alkyl group may be substituted by OR$^6$, N(R$^8$)(R$^9$), or a halogen atom), OR$^6$, R$^7$S(O)$_p$, R$^7$SO$_3$, N(R$^8$)(R$^9$), Si(R$^{10}$)(R$^{11}$)(R$^{12}$), B(R$^{13}$)(R$^{14}$), a halogen atom, (R$^{15}$)(R$^{16}$)P(O)$_q$, and a group represented by the formula given below:

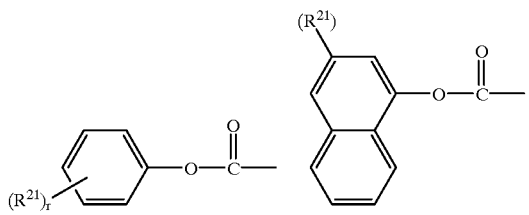

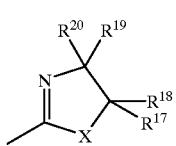 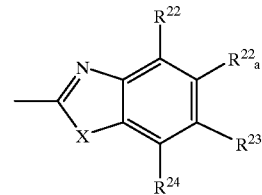

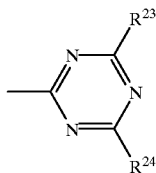 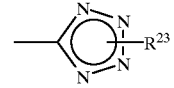

wherein, the sum of Hammett σ constants of R$^2$~R$^4$ is +0.36~+2.58;

X represents O, S, or NR$^{21}$;

R$^5$ may be a hydrogen atom, an alkyl group having 1 to 12 carbon atoms, or the substituent group represented by the formula (a), wherein the substituent group represented by the formula (a) may have on the phenyl ring thereof a substituent selected from the group consisting of an alkyl group having 1 to 6 carbon atoms, an alkoxy group having 1 to 12 carbon atoms, and a halogen atom;

R$^6$~R$^7$ each independently represent a group selected from the group consisting of an alkyl group, which has 1 to 12 carbon atoms and may be substituted by a halogen atom, a phenyl group, and the group represented by the formula (a), wherein the phenyl group and the substituent group represented by the formula (a) may each have on the phenyl ring thereof a substituent selected from the group consisting of an alkyl group having 1 to 6 carbon atoms, an alkoxy group having 1 to 12 carbon atoms, and a halogen atom;

$R^8 \sim R^{16}$ each independently represent a group selected from the group consisting of an alkyl group having 1 to 12 carbon atoms, a cycloalkyl group having 3 to 12 carbon atoms, a phenyl group, and the group represented by the formula (a), wherein the phenyl group and the substituent group represented by the formula (a) may each have on the phenyl ring thereof a substituent selected from the group consisting of an alkyl group having 1 to 6 carbon atoms, an alkoxy group having 1 to 12 carbon atoms, and a halogen atom;

$R^8 \sim R^9$ may form together with the nitrogen atom to which $R^8$ and $R^9$ are linked an aliphatic 6-membered ring, which may further contain another heteroatom, such as O or S;

$R^{17} \sim R^{20}$ each independently represent a group selected from the group consisting of hydrogen, an alkyl group that has 1 to 12 carbon atoms and may be substituted by an alkoxy group having 1 to 12 carbon atoms, a phenyl group, and a group represented by the formula (a), wherein the phenyl group and the substituent group represented by the formula (a) may each have on the phenyl ring thereof a substituent selected from the group consisting of an alkyl group having 1 to 6 carbon atoms, an alkoxy group having 1 to 12 carbon atoms, and a halogen atom;

$R^{21}$ represents a hydrogen atom or an alkyl group having 1 to 12 carbon atoms;

$R^{22} \sim R^{24}$ each independently represent a group selected from the group consisting of: hydrogen; an alkyl group that has 1 to 12 carbon atoms and may be substituted by an alkoxy group having 1 to 12 carbon atoms, an hydroxy group, or a halogen atom; and a phenyl group that may be substituted by an alkoxy group having 1 to 12 carbon atoms, an hydroxy group, or a halogen atom; and q is an integer of 0 to 1, and r is an integer of 0 to 5.

2. A photosensitive composition comprising a polymerizable monomer, a diazonium salt compound, and a compound represented by the general formula (III-1), (III-2), or (IV) given below:

General formula (III-1)

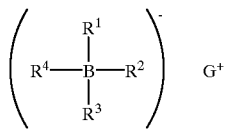

General formula (III-2)

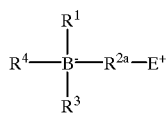

wherein, in the general formulas (III-1) and (III-2), $R^1$, $R^2$, $R^{2a}$, $R^3$, $R^4$, and E are the same as those defined in the general formulas (I-1) and (I-2); and G represents a group capable of forming a cation;

General formula (IV)

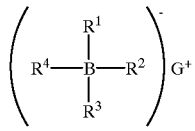

wherein, in the general formula (IV), $R^1$, $R^2$, $R^3$, and $R^4$ are the same as those defined in the general formula (I-1); and G represents a group capable of forming a cation.

* * * * *